(12) United States Patent  
Iizumi et al.

(10) Patent No.: US 8,043,793 B2
(45) Date of Patent: Oct. 25, 2011

(54) METHOD FOR MANUFACTURING ELECTROLUMINESCENCE ELEMENT

(75) Inventors: Yasuhiro Iizumi, Setagaya-ku (JP); Masaya Shimogawara, Tsukuba (JP)

(73) Assignee: Dai Nippon Printing Co., Ltd., Tokyo-To (JP)

( * ) Notice: Subject to any disclaimer, the term of this patent is extended or adjusted under 35 U.S.C. 154(b) by 622 days.

(21) Appl. No.: 12/239,133

(22) Filed: Sep. 26, 2008

(65) Prior Publication Data

US 2009/0087792 A1   Apr. 2, 2009

(30) Foreign Application Priority Data

Sep. 28, 2007   (JP) ................................ 2007-256588

(51) Int. Cl.
  *G03F 7/00* (2006.01)
  *G03F 7/20* (2006.01)
  *G03F 7/26* (2006.01)
  *B32B 3/10* (2006.01)

(52) U.S. Cl. ........ 430/311; 430/315; 430/322; 430/329; 430/312; 428/195.1

(58) Field of Classification Search ............... 430/270.1, 430/311, 315, 322, 329; 428/195.1
See application file for complete search history.

(56) References Cited

U.S. PATENT DOCUMENTS

| | | | |
|---|---|---|---|
| 7,061,556 B2 * | 6/2006 | Sugihara et al. | 349/49 |
| 2004/0108808 A1 * | 6/2004 | Kumagai et al. | 313/505 |
| 2006/0170331 A1 * | 8/2006 | Bertram et al. | 313/498 |
| 2007/0172773 A1 * | 7/2007 | Itou et al. | 430/321 |
| 2007/0259466 A1 * | 11/2007 | Sakata et al. | 438/29 |
| 2008/0150423 A1 * | 6/2008 | Kim et al. | 313/504 |
| 2009/0085473 A1 * | 4/2009 | Iizumi et al. | 313/504 |
| 2009/0091254 A1 * | 4/2009 | Jeong et al. | 313/504 |
| 2009/0142556 A1 * | 6/2009 | Lang et al. | 428/195.1 |
| 2009/0155723 A1 * | 6/2009 | Lang et al. | 430/311 |
| 2010/0090195 A1 * | 4/2010 | Parsapour | 257/13 |

FOREIGN PATENT DOCUMENTS

| | | |
|---|---|---|
| JP | 2000-249821 | 9/2000 |
| JP | 2005-522005 | 7/2005 |
| JP | 2006-520077 | 8/2006 |
| JP | 2006-318876 | 11/2006 |
| JP | 2007-021670 | 2/2007 |
| WO | 03/084292 | 10/2003 |
| WO | 2004/081141 | 9/2004 |

OTHER PUBLICATIONS

U.S. Appl. No. 12/680,439, filed Mar. 26, 2010, Iizumi, et al.

* cited by examiner

*Primary Examiner* — Amanda C. Walke
(74) *Attorney, Agent, or Firm* — Oblon, Spivak, McClelland, Maier & Neustadt, L.L.P.

(57) ABSTRACT

The present invention provides a method for manufacturing an electroluminescence element that has a light emitting layer containing a quantum dot and exhibits excellent life characteristics. In the method, patterning of the light emitting layer can be stably performed by a lift-off method. A photoresist layer is formed on a substrate having a first electrode layer. The photoresist layer is then exposed, developed, and patterned to ensure that a portion of the photoresist layer, which is located in a light emission area, is removed. A coating liquid containing a quantum dot having a silane coupling agent attached to the surface thereof is coated on the resultant substrate having the patterned photoresist layer and cured to form a light emitting layer. The remaining photoresist layer is then removed to lift off a portion of the light emitting layer, which is present on the photoresist layer.

18 Claims, 4 Drawing Sheets

METHOD FOR MANUFACTURING ELECTROLUMINESCENCE ELEMENT

CROSS-REFERENCE TO RELATED APPLICATIONS

The present application benefits from Japanese application JP2007-256588, filed on Sep. 28, 2007, the disclosure of which is hereby incorporated by reference in its entirety.

BACKGROUND OF THE INVENTION

1. Field of the Invention

The present invention relates to a method for manufacturing an electroluminescence element (hereinafter also called an EL element in some cases) having a light emitting layer that contains a quantum dot and is formed by photolithography.

2. Description of the Related Art

In an EL element, a hole injected from one of two electrodes facing each other and an electron injected from the other of the electrodes are coupled in a light emitting layer; a light emitting material included in the light emitting layer is excited by energy generated by the coupling; and light of a color obtained based on the light emitting material is emitted. Such EL elements have attracted attention as self-luminous planar display elements.

It is general that a light emitting layer and the like are patterned in a process of manufacturing a display device having an EL element. As the method for patterning the light emitting layer, the following methods have been proposed: a method for depositing a light emitting material through a shadow mask; a method for color-coding materials based on an ink jet scheme; a photolithography method; and the like. In the photolithography method, a vacuum facility having a high-precision alignment mechanism and the like are not required, unlike the method for depositing a material to form a pattern. Therefore, an EL element can be manufactured by the photolithography method in a relatively easy manner and at low cost. Compared with the method for color-coding materials based on an ink jet scheme to form a pattern, the photolithography method is preferable since pre-treatments on a structure for assisting the patterning and on a substrate are not performed in the photolithography method. In addition, the photolithography method is more advantageous in terms of formation of a high-precision pattern than the method for color-coding materials based on an ink jet scheme to form a pattern because of the relationship with delivery accuracy of an ink jet head.

As a method for patterning a light emitting layer by photolithography, an etching method, a lift-off method and the like have been proposed. In the lift-off method, the light emitting layer is not exposed by etching, unlike the etching method. The lift-off method can suppress a reduction in performance of the light emitting layer such as light emission characteristics. To pattern a light emitting layer capable of emitting light of multiple colors in the lift-off method, a light emitting layer portion for emitting light of a first color is patterned. Then, a photoresist layer to be used to pattern a light emitting layer portion for emitting light of a second color is formed thereon. It is, therefore, required that the light emitting layer be not dissolved and dispersed in a photoresist solvent, a developer and the like.

In recent years, a light emitting element having a light emitting layer containing a quantum dot composed of a semiconductor particle has been proposed and developed. The quantum dot is a crystal (approximately several nanometers to several tens nanometers) of semiconductor atoms. Since the quantum dot is the nano-sized crystal, electrons confined in the quantum dot exhibit a discrete energy level without exhibiting a continuous energy band structure. The quantum size effect is therefore remarkable. The quantum confinement effect is higher than that in a bulk crystal having a size larger than the quantum dot. The probability of recombination of excitons can be increased. In the light emitting element having the quantum dot, the frequency of light to be emitted can be adjusted while the configuration of the light emitting layer is not changed. The quantum dot exhibits optical characteristics depending on the size thereof due to the quantum confinement effect. For example, the color of light to be emitted from a quantum dot composed of CdSe can be changed from blue to red by simply changing the size of the quantum dot. Even when the quantum dot has a relative small half width, light is emitted from the quantum dot. The half width of the quantum dot can be set to 30 nanometers or less to ensure that light is emitted from the quantum dot. The quantum dot is therefore suitable as a material of the light emitting layer.

It should be noted that although the quantum dot is also called a nano-crystal, a fine particle, a colloid, or a cluster, a material capable of producing the quantum size effect is regarded as the quantum dot in the present application.

As a method for forming a light emitting layer having such a quantum dot, a spin coating method and a dip coating method are known (refer to JP-A-2005-522005 and JP-A-2006-520077, for example). In each of the spin coating method and the dip coating method, a colloid solution containing a quantum dot having a ligand such as tri-n-octylphosphine oxide (TOPO) attached to the surface thereof is used. Since the ligand is attached to the surface of the quantum dot, the ligand serves to improve stability of dispersion of the quantum dots.

To pattern the light emitting layer formed by means of the quantum dots through the lift-off method, it is required that the light emitting layer be not dissolved and dispersed in a photoresist solvent, developer and the like. The ligand (such as tri-n-octylphosphine oxide) attached to the surface of the quantum dot is soluble in many kinds of solvents. It has been, therefore, difficult to form a photoresist layer (to be used to pattern another light emitting layer) on the patterned light emitting layer.

In the conventional light emitting layer containing the quantum dot having the ligand such as TOPO attached to the surface thereof, the quantum dot is not stable. Therefore, the instability may affect the life characteristics of the light emitting element. When the quantum dot is a phosphorescent material, the life characteristics of the light emitting element are easily affected since the life of the phosphorescent material is longer than the life of a fluorescent material.

It is, therefore, an object of the present invention to provide a method for manufacturing an EL element having excellent life characteristics and having a light emitting layer that contains a quantum dot and can be patterned with high stability by a lift-off method.

SUMMARY OF THE INVENTION

In order to accomplish the object, a method for manufacturing an electroluminescence element according to the present invention comprises the steps of: preparing a substrate having a first electrode layer formed thereon; forming a photoresist layer on the substrate having the first electrode layer formed thereon; exposing and developing the photoresist layer, and patterning the photoresist layer to ensure that a portion of the photoresist layer, which is located in a light emission area, is removed; coating a coating liquid on the resultant substrate having the patterned photoresist layer, and curing the coating liquid to form a light emitting layer, the coating liquid containing a quantum dot having a silane coupling agent attached to the surface thereof; and removing the remaining photoresist layer to lift off a portion of the light emitting layer, which is present on the photoresist layer.

According to the present invention, since the silane coupling agent is used as a ligand for the quantum dot, the light emitting layer can be cured to improve stability of the quantum dot included in the light emitting layer and life characteristics of the EL element. In addition, molecular design of the silane coupling agent is relatively easy. The silane coupling agent has functional groups exhibiting various kinds of functionality and is used to improve the life characteristics of the EL element. The coating liquid contains the silane coupling agent. The coating liquid is coated and cured to form the light emitting layer. The photoresist layer to be used to pattern another light emitting layer can therefore be stably formed on the light emitting layer. Adhesiveness between the light emitting layer and foundation layers (the first electrode layer, a hole injection transport layer, etc.) formed under the light emitting layer can be improved by coupling the silane coupling agent contained in the light emitting layer and the foundation layers formed under the light emitting layer. Furthermore, thermal stability (Tg: glass transition temperature) of the light emitting layer can be improved.

According to the present invention, a method for manufacturing an electroluminescence element having a patterned light emitting layer that is capable of emitting light of an N (N is an integer of two or more) number of colors comprises the steps of: preparing a substrate having a first electrode layer formed thereon; forming a first color photoresist layer on the substrate having the first electrode layer formed thereon; exposing and developing the first color photoresist layer, and patterning the first color photoresist layer to ensure that a portion of the first color photoresist layer, which is located in a first color light emission area, is removed; coating a first coating liquid on the resultant substrate having the patterned photoresist layer and curing the first coating liquid to form a first color light emitting layer portion, the first coating liquid containing a first quantum dot having a silane coupling agent attached to the surface thereof; removing the remaining first color photoresist layer to lift off a part of the first color light emitting layer portion, which is present on the first color photoresist layer; forming a second color photoresist layer on the resultant substrate having the first electrode layer and the patterned first color light emitting layer portion; exposing and developing the second color photoresist layer and patterning the second color photoresist layer to ensure that a portion of the second color photoresist layer, which is located in a second color light emission area, is removed; coating a second coating liquid on the resultant substrate having the patterned second color photoresist layer and curing the second coating liquid to form a second color light emitting layer portion, the second coating liquid containing a second quantum dot having a silane coupling agent attached to the surface thereof; and removing the remaining second color photoresist layer to lift off a part of the second color light emitting layer portion, which is present on the second color photoresist layer.

According to the present invention, since the silane coupling agent is used as ligands for the first and second quantum dots, the light emitting layer can be cured to improve stability of the quantum dots included in the light emitting layer and life characteristics of the EL element. In addition, molecular design of the silane coupling agent is relatively easy. The silane coupling agent has the functional groups exhibiting various kinds of functionality and is used to improve the life characteristics of the EL element. Furthermore, the first coating liquid (for formation of the first color light emitting layer portion) containing the silane coupling agent is coated and cured to form the first color light emitting layer portion. The first color light emitting layer portion can therefore be insoluble in a photoresist solvent, a developer and the like, which are used for the second color photoresist layer used to pattern the second color light emitting layer portion. The silane coupling agent included in each of the light emitting layer portions is coupled with foundation layers (the first electrode layer, a hole injection transport layer, etc.) formed under the light emitting layer to improve adhesiveness between the light emitting layer and the foundation layers formed under the light emitting layer. Thermal stability (Tg: glass transition temperature) of the light emitting layer can be improved.

In the present invention, it is preferable that the integer N be three. This results from the fact that a typical light emitting layer is capable of emitting light of three colors of red, green, and blue and is used for color display.

According to the present invention, the following may be performed in the step of forming the light emitting layer, or in each of the step of forming the first color light emitting layer portion and the step of forming the second color light emitting layer portion. That is, the coating liquid (for formation of each of the light emitting layer and the light emitting layer portions) containing a hole transport material, a solvent, and the quantum dot having the silane coupling agent attached to the surface thereof is coated; a coating film is formed by the coating; the hole transport material and the quantum dot having the silane coupling agent attached to the surface thereof are then separated from each other while the solvent contained in the coating film is removed to ensure that the hole transport material is located on the side of the first electrode layer and that the quantum dot having the silane coupling agent attached to the surface thereof is located on the side of a top surface of the coating film in order to form a hole transport layer and the light emitting layer. The hole transport layer and the light emitting layer can therefore be phase-separated, resulting in improvements in a light emission efficiency and life characteristics of the EL element. The hole transport layer facilitates transportation of holes into the light emitting layer to improve the light emission efficiency.

In the present invention, the coating liquid (for formation of each of the light emitting layer and the light emitting layer portions) may further contain at least one of the hole transport material and an electron transport material. A combination of the quantum dots and at least one of the materials makes it possible to simplify the process of manufacturing an EL element, efficiently transport charges into the light emitting layers, and efficiently transfer energy of an exciton generated by a recombination of a hole and an electron. This results in an improvement in the life characteristics of the EL element.

According to the present invention, before the step of forming the photoresist layer, a coating liquid (for formation of a hole injection layer) containing a hole injection material and a curable binder may be coated on the substrate having the first electrode layer and cured to form the hole injection layer. The formation of the hole injection layer stabilizes injection of holes into the light emitting layer to improve the light emission efficiency.

According to the present invention, the silane coupling agent may be a silicon compound represented by $Y_n SiX_{(4-n)}$ (where, Y represents an alkyl group, a fluoroalkyl group, a vinyl group, an amino group, a phenyl group or an epoxy group; X represents an alkoxyl group, an acetyl group or a halogen group; and n represents an integer of 0 to 3). Molecular design of the silicon compound is relatively easy. The groups X and Y are appropriately selected to control condensation of the compound and the like. This makes it possible to obtain desired stability of the quantum dots included in the light emitting layer.

According to the present invention, the silane coupling agent may be a silicon compound represented by $Y_n SiX_{(4-n)}$ (where, Y represents any one of a functional group that is directly bonded to the silicon or bonded to the silicon through a vinyl group or a phenyl group and exhibits a hole transport property, a functional group that is directly bonded to the silicon or bonded to the silicon through a vinyl group or a phenyl group and exhibits an electron transport property, and a functional group that is directly bonded to the silicon or bonded to the silicon through a vinyl group or a phenyl group and exhibits both of the hole transport property and the electron transport property; X represents an alkoxyl group, an acetyl group, or a halogen group; and n represents an integer of 0 to 3). Molecular design of the silicon compound is relatively easy. It is possible that the silicon compound has functional groups exhibiting various kinds of functionality. The life characteristics of the EL element can be improved.

According to the present invention, it is preferable that the quantum dot have a core and a shell. In this case, the core is composed of a semiconductor fine particle, and the shell surrounds the core and is composed of a material having a band gap larger than that of the semiconductor fine particle. This structure stabilizes the quantum dot.

According to the present invention, since the silane coupling agent is used as the ligand for the quantum dot, a reduction in the life characteristics can be suppressed by the ligand. In addition, a photoresist layer to be used to pattern another light emitting layer can be stably laminated on the light emitting layer.

DESCRIPTION OF THE PREFERRED
EMBODIMENTS

A method for manufacturing an EL element according to first and second embodiments of the present invention will be described below.

In the first embodiment, a light emitting layer for emitting light of at least one color is formed and patterned. In the second embodiment, a light emitting layer for emitting light of an N number (N is an integer of two or more) of colors is formed and patterned. The first and second embodiments will be described below.

First Embodiment

According to the first embodiment of the present invention, the method for manufacturing an electroluminescence element comprises the steps of: preparing a substrate having a first electrode layer formed thereon; forming a photoresist layer on the substrate having the first electrode layer formed thereon; exposing and developing the photoresist layer, and patterning the photoresist layer to ensure that a portion of the photoresist layer, which is located in a light emission area, is removed; coating a coating liquid on the resultant substrate having the patterned photoresist layer, curing the coating liquid to form a light emitting layer, the coating liquid containing a quantum dot having a silane coupling agent attached to the surface thereof; removing the remaining photoresist layer to lift off a portion of the light emitting layer, which is present on the photoresist layer.

The method for manufacturing an EL element according to the present embodiment will be described with reference to accompanying drawings.

Figure 1:
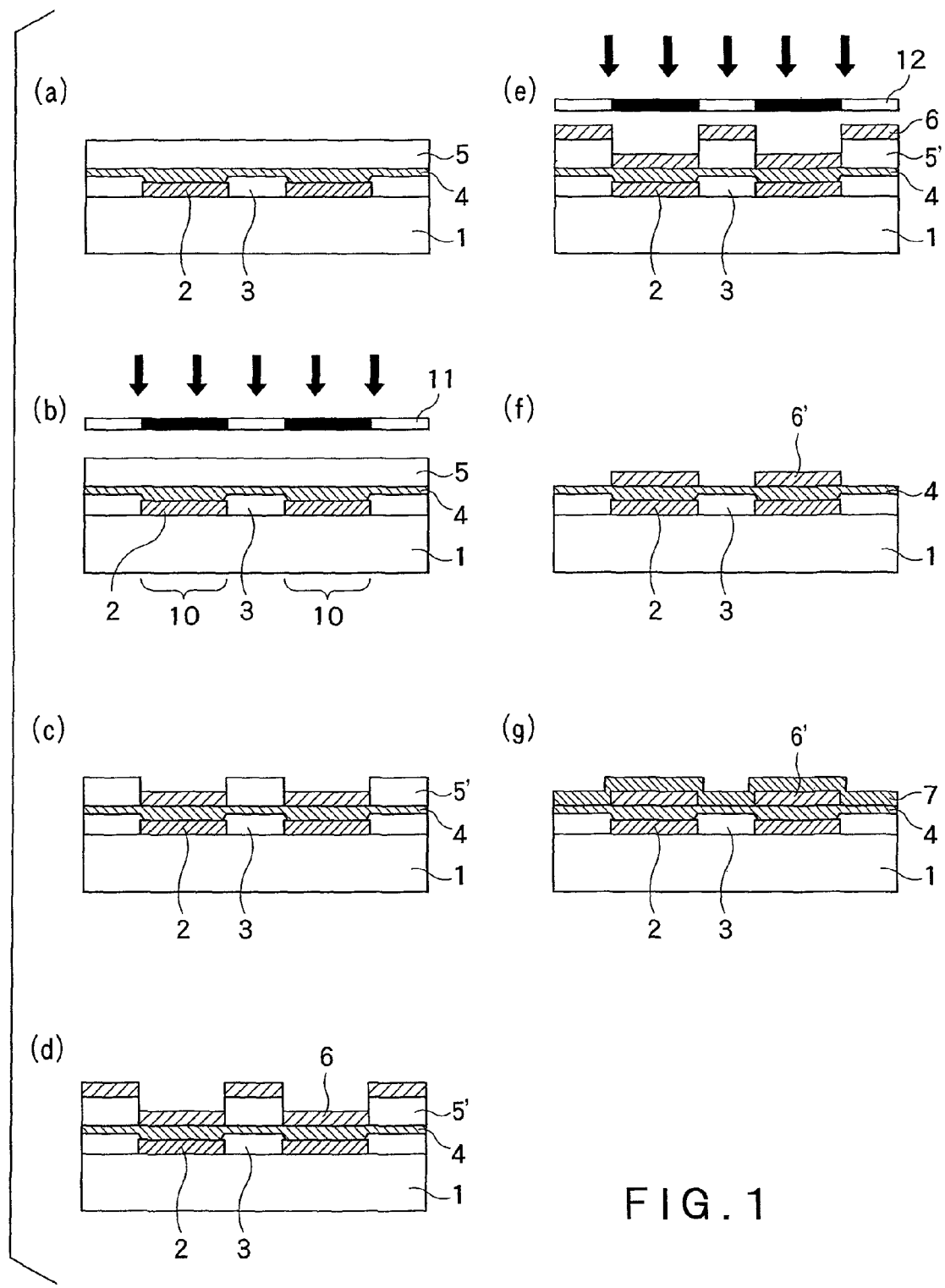
FIGS. 1(a) to 1(g) are process diagrams showing an example of a method for manufacturing an EL element according to the present invention.

FIGS. 1(a) to 1(g) are process diagrams showing an example of the method for manufacturing an EL element according to the present embodiment. A first electrode layer 2 is formed and patterned on a substrate 1. An insulating layer 3 is then formed between portions of the first electrode layer 2. A hole injection layer 4 is formed on the first electrode layer 2 and the insulating layer 3 (in a hole injection layer formation process). Then, a positive photoresist is coated on the hole injection layer 4 to form a photoresist layer 5 (in a photoresist layer formation process, as shown in FIG. 1(a)).

Next, the photoresist layer 5 is exposed through a photomask 11 to ensure that a portion of the photoresist layer 5, which is located in a light emission area 10, is removed; the photoresist layer 5 is developed by a photoresist developer and cleaned; and the photoresist layer 5 is then patterned (in a photoresist layer patterning process, as shown in FIGS. 1(b) and 1(c)). The patterned photoresist layer 5 is indicated by reference number 5'.

Then, the coating liquid containing the quantum dot having the silane coupling agent attached to the surface thereof is coated on the hole injection layer 4 and the patterned photoresist layer 5' to form a light emitting layer 6 (in a light emitting layer formation process, as shown in FIG. 1(d)).

The photoresist layer 5' is then exposed through a photomask 12; the photoresist layer 5' is then developed by a photoresist developer and cleaned; the remaining photoresist layer 5' is removed to lift off a portion of the light emitting layer 6, which is present on the photoresist layer 5'; and the light emitting layer 6 is patterned (in a light emitting layer patterning process, as shown in FIGS. 1(e) and 1(f)). The patterned light emitting layer 6 is denoted by reference number 6'. Lastly, a second electrode layer 7 is formed on the light emitting layer 6' (in a second electrode layer formation process, as shown in FIG. 1(g)).

Figure 2:
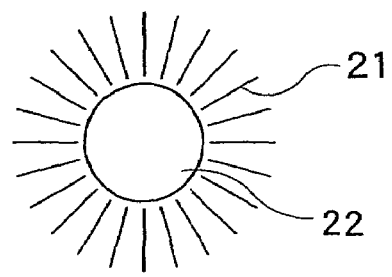
FIG. 2 is a schematic diagram showing a quantum dot having a silane coupling agent attached to the surface thereof.

Referring to FIG. 2, a quantum dot 22 having a silane coupling agent 21 attached to the surface of the quantum dot 22 is used as the coating liquid for formation of the light emitting layer. The silane coupling agent 21 serves as a ligand and is attached to the surface of the quantum dot 22. The quantum dot 22 and the silane coupling agent 21 are bonded to each other by a coordination bond. When the quantum dot is a compound semiconductor, an OH group of a Si—OH group of the silane coupling agent hydrolyzed can be bonded to the quantum dot by a coordination bond since the surface of an inorganic material is lyophilic in general.

According to the present embodiment, the coating liquid (for formation of the light emitting layer) containing the quantum dot having the silane coupling agent attached to the surface of the quantum dot is coated and cured to form the light emitting layer. The stability of the quantum dot included in the light emitting layer is excellent. This makes it possible to improve the life characteristics of the EL element. In addition, molecular design of the silane coupling agent is relatively easy. The silane coupling agent has functional groups exhibiting various kinds of functionality and allows the life characteristics to be improved.

According to the present embodiment, since the coating liquid (for formation of the light emitting layer) containing the quantum dot having the silane coupling agent attached to the surface of the quantum dot is coated and cured to form the light emitting layer, the photoresist to be used to pattern another light emitting layer can be coated to stably form the photoresist layer on the light emitting layer while the light emitting layer is not dissolved by a photoresist solvent. In addition, the light emitting layer is not dissolved by the photoresist developer during patterning of the photoresist layer. As a result, a reduction in characteristics of the light emitting layer can be suppressed.

Furthermore, since the coating liquid (for formation of the light emitting layer) containing the silane coupling agent is used to form the light emitting layer, adhesiveness between the light emitting layer and the foundation layers (the first electrode layer, the hole injection layer, etc.) provided under the light emitting layer can be improved by coupling the silane coupling agent included in the light emitting layer and the foundation layers. Furthermore, since the coating liquid (for formation of the light emitting layer) containing the silane coupling agent is used to form the light emitting layer, thermal stability (Tg: glass transition temperature) of the light emitting layer can be improved.

Processes of the method for manufacturing an EL element according to the present embodiment will be described.

1. Process of Forming Photoresist Layer

In the process of forming the photoresist layer according to the present embodiment, the photoresist layer is formed on the substrate having the first electrode layer. A description will be made of the method for forming the photoresist layer, the substrate, and the first electrode layer.

(1) Method for Forming Photoresist Layer

A positive photoresist is preferable as the photoresist used in the present embodiment. The photoresist layer is easily detached when the positive photoresist is used. The positive photoresist is advantageous in order to lift off a portion of the light emitting layer. A general photoresist such as novolac resin and rubber-bisazide resin can be used as the positive photoresist.

A general photoresist solvent can be used as the photoresist solvent used for the photoresist. According to the present invention, since the coating liquid (for formation of the light emitting layer) containing the silane coupling agent is cured to form the light emitting layer, it is not necessary that solubility of the light emitting layer and the like are considered for selection of the photoresist solvent. If the process of forming the hole injection layer is performed before the process of forming the photoresist layer, it is preferable that the photoresist solvent do not dissolve a material forming the hole injection layer and the like to prevent the hole injection layer from being mixed with or dissolved by the photoresist when the photoresist is coated on the hole injection layer. A solvent described in JP-A-2006-318876 can be used as the photoresist solvent.

The method for coating the photoresist is not limited as long as the photoresist is coated on the entire surface of the substrate. As the method for coating the photoresist, a spin coating method, a casting method, a dip coating method, a bar coating method, a blade coating method, a roll coating method, a gravure coating method, a spray coating method, a flexographic printing method, or the like may be used.

The thickness of the photoresist layer is not limited, but is preferably in a range of 0.1 µm to 10 µm, more preferably in a range of 0.5 µm to 5 µm. When the thickness of the photoresist layer is excessively large, it may be difficult to remove the remaining photoresist layer in the process (described later) of patterning the light emitting layer. When the thickness of the photoresist layer is excessively small, it may be difficult to finely pattern the light emitting layer by the lift-off method.

(2) Substrate

The substrate used in the present embodiment may have or may not have transparency. When the EL element shown in FIG. 1(g) is of bottom emission type, the substrate 1 preferably has transparency. When the EL element shown in FIG. 1(g) is of top emission type, the substrate 1 does not need to have transparency. When the EL element shown in FIG. 1(g) is configured to emit light from both of the top and bottom surfaces of the EL element, the substrate 1 preferably has transparency. As the substrate having transparency, an inorganic material such as glass, and transparent resin may be used.

The type of the transparent resin is not limited as long as the transparent resin is formed into a film shape. The transparent resin preferably has high transparency, a relatively high lyophobic property and a relatively high heat resistance property. As the transparent resin, polyether sulfone, polyethylene terephthalate (PET), polycarbonate (PC), polyetheretherketone (PEEK), polyvinylfluoride (PFV), polyacrylate (PA), polypropylene (PP), polyethylene (PE), amorphous polyolefin, or fluorinated resin may be used.

(3) First Electrode Layer

The first electrode layer used in the present embodiment may be an anode or a cathode. In general, in the process of manufacturing the EL element, the EL element can be stably formed when the layers are laminated from the anode side. The first electrode layer is preferably the anode.

It is preferable that a conductive material having a large work function be used as the anode to make it easy to inject a hole. On the other hand, it is preferable that a conductive material having a small work function be used as the cathode to make it easy to inject an electron. As the conductive materials, a metal material is used in general. An organic material and an inorganic compound may be used as the conductive materials. Different types of materials may be mixed with each other and used as the first electrode layer.

The first electrode layer may have or may not have transparency. A material having transparency or a material not having transparence is selected as the first electrode layer based on the surface (of the EL element) from which light is output. When the EL element shown in FIG. 1(g) is of bottom emission type, the first electrode layer 2 preferably has transparency. On the other hand, when the EL element shown in FIG. 1(g) is of top emission type, the first electrode layer 2 does not need to have transparency. In addition, when the EL element shown in FIG. 1(g) is configured to emit light from both of the top surface and bottom surface of the EL element, the first electrode layer 2 preferably has transparency.

As the conductive material having transparency, a material made of In—Zn—O (IZO), a material made of In—Sn—O (ITO), a material made of Zn—O—Al, a material made of Zn—Sn—O, and the like may be used. As the conductive material that does not need to have transparency, metal may be used. Specifically, Au, Ta, W, Pt, Ni, Pd, Cr, an Al alloy, an Ni alloy, a Cr alloy, and the like may be used as the conductive material that does not need to have transparency.

The first electrode layer preferably has relatively small resistance when the first electrode layer is the anode or the cathode.

A typical method for forming an electrode layer may be used as the method for forming the first electrode layer. Specifically, a sputtering method, an ion plating method, a vacuum deposition method and the like may be used as the method for forming the first electrode layer. As the method for patterning the first electrode layer, a photolithography method may be used.

2. Process of Patterning Photoresist Layer

In the process of patterning the photoresist layer according to the present embodiment, the photoresist layer is exposed, developed, and patterned to ensure that a portion of the photoresist layer, which is located in the light emission area, is removed.

As the method for exposing the photoresist layer and patterning the photoresist layer, a method for exposing the layer through a photomask, a laser lithography method and the like may be used.

When the positive photoresist is used during exposing and patterning, the photoresist layer is exposed to ensure that at least the portion of the photoresist layer, which is located in the light emission area, is not exposed.

The photoresist developer used in the present embodiment is not limited. If the process of forming the hole injection layer is performed before the process of forming the photoresist layer, it is preferable that the photoresist developer do not dissolve the material forming the hole injection layer and the like. As the photoresist developer, an organic alkaline developer, an inorganic alkaline developer and an aqueous solution that allows the first color photoresist layer to be developed may be used.

After the photoresist layer is developed, the photoresist layer is preferably cleaned with water.

3. Process of Forming Light Emitting Layer

In the process of forming the light emitting layer according to the present embodiment, the coating liquid (for formation of the light emitting layer) containing the quantum dot having the silane coupling agent attached to the surface thereof is coated on the substrate having the patterned photoresist layer, and cured to form the light emitting layer.

In the process of forming the light emitting layer according to the present embodiment, the coating liquid containing the quantum dot having the silane coupling agent attached to the surface thereof may be used to form the single light emitting layer (first example). Alternatively, in the process of forming the light emitting layer according to the present embodiment, a coating liquid (for formation of the light emitting layer) containing the quantum dot having the silane coupling agent attached to the surface thereof and at least one of the material forming the hole transport layer and a material forming an electron transport layer may be used to form the single light emitting layer (second example). Alternatively, in the process of forming the light emitting layer according to the present embodiment, a coating liquid (for formation of the light emitting layer) containing the quantum dot having the silane coupling agent attached to the surface thereof and the material forming the hole transport layer may be used to form the light emitting layer and the hole transport layer (third example). The first to third examples will be described below.

(1) First Example

In the process of forming the light emitting layer according to the first example, the coating liquid (for formation of the light emitting layer) containing the quantum dot having the silane coupling agent attached to the surface thereof is coated on the substrate having the photoresist layer patterned, and cured to form the single light emitting layer. The coating liquid (for formation of the light emitting layer) and the method for forming the light emitting layer will be described below.

(i) Coating Liquid for Formation of Light Emitting Layer

The coating liquid (for formation of the light emitting layer) used in the present embodiment contains the quantum dot having the silane coupling agent attached to the surface of the quantum dot. Typically, the quantum dot having the silane coupling agent attached to the surface thereof is dispersed in a solvent. Materials contained in the coating liquid will be described below.

(Quantum Dot)

The quantum dot used in the present example is not limited as long as the quantum dot emits fluorescent light or phosphorescent light. The quantum dot preferably contains a compound semiconductor. As the compound semiconductor, a IV group compound, a I-VII group compound, a II-VI group compound, a II-V group compound, a III-VI group compound, a III-V group compound, a IV-VI group compound, a I-III-VI group compound, a II-IV-VI group compound, a II-IV-V group compound, and the like may be used. Specifically, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, or a mixture thereof may be used as the compound semiconductor. Among the above compounds, CdSe is preferable from the perspective of versatility and optical characteristics.

The quantum dot may be composed only of a core made of a semiconductor fine particle. The quantum dot may have the core and a shell made of a material that surrounds the core and has a band gap larger than the semiconductor fine particle. The quantum dot preferably has the core and the shell. That is, the quantum dot preferably has a core-shell structure and is preferably a core-shell structured quantum dot. In this case, the stability of the quantum dot is improved.

As the semiconductor fine particle used in the core, a fine particle of any of the abovementioned compound semiconductors is preferably used.

A material used in the shell is not limited as long as the material has a band gap larger than the semiconductor fine particle. The material used in the shell is preferably any of the compound semiconductors, like the semiconductor fine particle. In this case, the compound semiconductor used in the shell may be the same as or different from the compound semiconductor used in the core.

The core and shell of the core-shell structured quantum dot may be respectively made of: CdSe and CdS; CdSe and ZnS; CdTe and CdS; InP and ZnS; GaP and ZnS; Si and ZnS; InN and GaN; InP and CdSSe; InP and ZnSeTe; GaInP and ZnSe; GaInP and ZnS; Si and AlP; InP and ZnSTe; GaInP and ZnSTe; GaInP and ZnSSe; or the like. The compounds CdSe and ZnS are preferable as the core and shell of the core-shell structured quantum dot, respectively, from the perspective of the versatility and optical characteristics.

The quantum dot may have a spherical shape, a rod shape, a disk shape, or the like. The shape of the quantum dot can be confirmed by a transmission electron microscope (TEM).

The diameter of the quantum dot is preferably less than 20 nm, more preferably in a range of 1 nm to 15 nm, still more preferably in a range of 1 nm to 10 nm. When the diameter of the quantum dot is excessively large, the quantum size effect may not be obtained. The quantum dot exhibits an emission spectrum that varies depending on the diameter of the quantum dot. The diameter of the quantum dot is selected based on a target color of light to be emitted. When the core and shell of the core-shell structured quantum dot are respectively made of CdSe and ZnS, the emission spectrum is shifted to the longer wavelength side as the diameter of the quantum dot is increased. In this case, when the diameter of the quantum dot is 5.2 nm, the quantum dot exhibits a red emission spectrum. When the diameter of the quantum dot is 1.9 nm, the quantum dot exhibits a blue emission spectrum. The diameter distribution of the quantum dot is preferably in a relatively small range. The diameter of the quantum dot can be confirmed by a transmission electron microscope (TEM), a powder X-ray diffraction (XRD) pattern, or a UV/Vis absorption spectrum.

When the total solid content of the coating liquid for formation of the light emitting layer is regarded as 100 weight percent, the content of the quantum dots having the silane coupling agent attached to the surfaces thereof in the coating liquid for formation of the light emitting layer is preferably in a range of 50 weight percent to 100 weight percent, more preferably in a range of 60 weight percent to 100 weight percent. When the content of the quantum dots is excessively low, light may not be sufficiently emitted. When the content of the quantum dots is excessively high, it may be difficult to form the light emitting layer.

For a method for combining the quantum dots, refer to JP-A-2005-522005, JP-A-2006-520077, JP-A-2007-21670 and the like.

The ligand attached to the surface of the quantum dot may be replaced with another ligand. For example, the ligand such as TOPO can be replaced with the silane coupling agent by the mixing quantum dots having a ligand such as TOPO attached to the surfaces thereof with a large amount of the silane coupling agent. A temperature during the replacement of the ligand is preferably set to a room temperature. For the method for the replacement of the ligand, refer to JP-A-2007-21670.

As a commercial product of the quantum dot having the ligand such as TOPO attached to the surface thereof, a fluorescent semiconductor nano-crystal "EviDot" made by Evident Technologies, Inc. and the like may be used.

(Silane Coupling Agent)

The silane coupling agent used in the present example is not limited as long as the silane coupling agent can be bonded to the quantum dot by a coordination bond to stabilize the quantum dot, and does not affect the life characteristics of the quantum dot. As the silane coupling agent, (1) chlorosilane, alkoxysilane and the like, and (2) reactive silicon may be used.

As the chlorosilane, alkoxysilane and the like described in the above item (1), silicide represented by $Y_nSiX_{(4-n)}$ is preferably used (where, Y represents an alkyl group, a fluoroalkyl group, a vinyl group, an amino group, a phenyl group, or an epoxy group; X represents an alkoxyl group, an acetyl group, or a halogen group; and n represents an integer of 0 to 3). The silicide may be made of at least one type of compound.

In the silicide represented by the abovementioned formula, the group X serves as a terminal portion and a portion bonded to the quantum dot by a coordination bond. A condensation reaction occurs at the terminal portion. The terminal portion serves to couple the quantum dots (having the silane coupling agent attached to the surfaces thereof) with each other. Also, the terminal portion serves to cause the light emitting layer to be insolubilized, and contributes to an improvement in the adhesiveness between the light emitting layer and the foundation layers provided under the light emitting layer.

It is preferable that the alkoxyl group represented by X be a methoxy group, an ethoxy group, a propoxy group, or a butoxy group.

In the silicide represented by the abovementioned formula, the group Y serves as a functional portion. When Y represents an alkyl group, the group serves as a spacer between the quantum dots and contributes to the solubility. When Y represents a fluoroalkyl group, the group serves as a spacer between the quantum dots and exhibits liquid repellency. When Y represents a vinyl group, the group serves as a spacer between the quantum dots and has a pi-conjugated system. When Y is an amino group, the group serves as a spacer between the quantum dots and exhibits a lyophilic property. When Y is a phenyl group, the group serves as a spacer between the quantum dots and exhibits repellency. When Y is an epoxy group, the group serves as a spacer between the quantum dots and contributes to a curable property.

The carbon number of the group represented by Y is preferable in a range of 1 to 20.

As the silicide represented by the abovementioned formula, silicide described in JP-A-2000-249821 and the like may be used.

As the chlorosilane, alkoxysilane and the like described in the above item (1), silicide represented by $Y_nSiX_{(4-n)}$ is also preferably used (where, Y represents any one of a functional group that is directly bonded to the silicon or bonded to the silicon through a vinyl group or a phenyl group and exhibits a hole transport property, a functional group that is directly bonded to the silicon or bonded to the silicon through a vinyl group or a phenyl group and exhibits an electron transport property, and a functional group that is directly bonded to the silicon or bonded to the silicon through a vinyl group or a phenyl group and exhibits both of the hole transport property and the electron transport property; X represents an alkoxyl group, an acetyl group, or a halogen group; and n represents an integer of 0 to 3). This silicide may be made of at least one type of compound.

In the silicide represented by the abovementioned formula, the group X serves as a terminal portion and a portion bonded to the quantum dot by a coordination bond. A condensation reaction occurs at the terminal portion. The terminal portion serves to couple the quantum dots (having the silane coupling agent attached to the surfaces thereof) with each other. Also, the terminal portion serves to cause the light emitting layer to be insolubilized, and contributes to an improvement in the adhesiveness between the light emitting layer and the foundation layers provided under the light emitting layer.

The alkoxyl group represented by X is preferably a methoxy group, an ethoxy group, a propoxy group, or a butoxy group.

In the silicide represented by the abovementioned formula, the group Y serves as a functional portion.

For example, when Y represents a functional group that is directly bonded to the silicon or bonded to the silicon through a vinyl group or a phenyl group and exhibits a hole transport property, a functional group serves as a spacer between the quantum dots and exhibits the hole transport property. When Y represents a functional group that is directly bonded to the silicon or bonded to the silicon through a vinyl group or a phenyl group and exhibits an electron transport property, the functional group serves as a spacer between the quantum dots and exhibits the electron transport property. When Y represents a functional group that is directly bonded to the silicon or bonded to the silicon through a vinyl group or a phenyl group and exhibits both of the hole transport property and the electron transport property, the functional group serves as a spacer between the quantum dots and exhibits both of the hole transport property and the electron transport property.

When Y represents the functional group that is directly bonded to the silicon or bonded to the silicon through the vinyl group or the phenyl group and exhibits the hole transport property, the functional group represented by Y is preferably bonded to the silicon through the vinyl group or the phenyl group and exhibits the hole transport property. This results from the fact that each of the vinyl group and the phenyl group has a pi-conjugated system. As the functional group exhibiting the hole transport property, an aromatic amine group containing at least one N atom, and an aryl group containing six to sixteen substituted or unsubstituted carbons, may be used. The aromatic amine group containing at least one N atom is preferably an aromatic tertiary amine group containing at least one N atom. Specifically, as the aromatic tertiary amine group containing at least one N atom, N,N'-bis(naphthalene-1-yl)-N,N'-bis(phenyl)-benzidine(α-NPD), and triphenylamine such as 4,4,4-tris(3-methylphenylphenylamino)triphenylamine(MTDATA) may be used. The triphenylamine may have a structure represented by the following formula.

[Chemical formula 1]

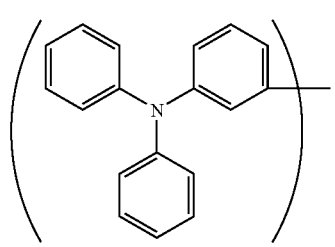

As the aryl group containing six to sixteen substituted or unsubstituted carbons, a phenyl group, a naphthyl group, a tolyl group, a xylyl group, an anthryl group, a phenanthryl group, a biphenyl group, a naphthacenyl group, and a pentacenyl group may be used.

When Y represents the functional group that is directly bonded to the silicon or bonded to the silicon through the vinyl group or the phenyl group and exhibits the electron transport property, the functional group represented by Y is preferably bonded to the silicon through the vinyl group or the phenyl group and exhibits the electron transport property. This results from the fact that each of the vinyl group and the phenyl group has a pi-conjugated system. As the functional group exhibiting the electron transport property, phenanthroline, triazole, oxadiazole, and aluminum quinolinol may be used. Specifically, bathocuprone(BCP), bathophenanthroline (Bpehn), and tris(8-hydroxyquinolinolato)aluminum(Alq3) may be used. The oxadiazole and triazole may have structures represented by the following formulas, respectively.

[Chemical formulas 2]

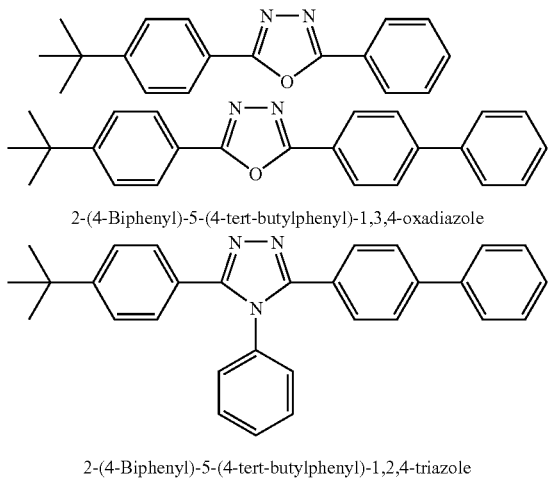

2-(4-Biphenyl)-5-(4-tert-butylphenyl)-1,3,4-oxadiazole 2-(4-Biphenyl)-5-(4-tert-butylphenyl)-1,2,4-triazole As the functional group exhibiting the electron transport property, an aryl group containing six to sixteen substituted or unsubstituted carbons may be used. The aryl group containing six to sixteen substituted or unsubstituted carbons is the same as or similar to the aryl group containing six to sixteen substituted or unsubstituted carbons, which is used as the functional group exhibiting the hole transport property.

When Y represents the functional group that is directly bonded to the silicon or bonded to the silicon through the vinyl group or the phenyl group and exhibits both of the electron transport property and the hole transport property, the functional group represented by Y is preferably bonded to the silicon through the vinyl group or the phenyl group and exhibits both of the electron transport property and the hole transport property. This results from the fact that each of the vinyl group and the phenyl group has the pi-conjugated system. As the functional group exhibiting both of the electron transport property and the hole transport property, distyrylarene, a poly-aromatic compound, an aromatic condensed ring, carbazole, and a heterocyclic ring may be used. Specifically, 4,4'-bis(2, 2-diphenyl-ethen-1-yl)diphenyl(DPVBi), 4,4'-bis(carbazol-9-yl)biphenyl(CBP), 4,4"-di(N-carbazolyl)-2',3',5',6'-tetraphenyl-p-terphenyl(CzTT), 1,3-bis(carbazole-9-yl)-benzene(m-CP), 9,10-di(naphtha-2-yl)anthracene (DNA), and the like may be used as the functional group exhibiting both of the electron transport property and the hole transport property and are represented by the following formulas.

[Chemical formulas 3]

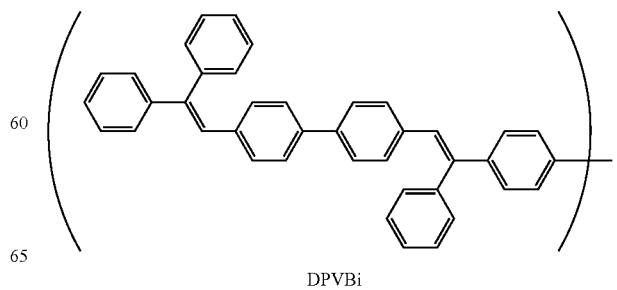

DPVBi

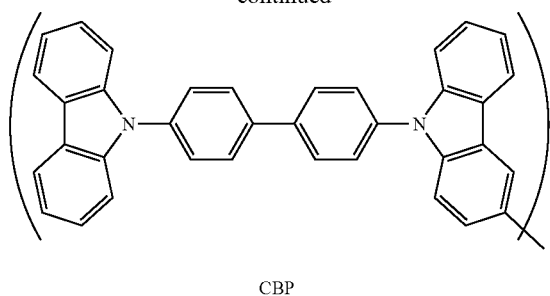

CBP

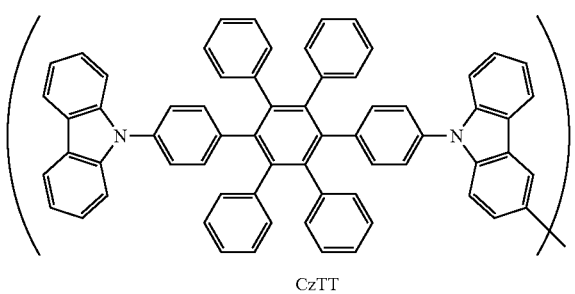

CzTT

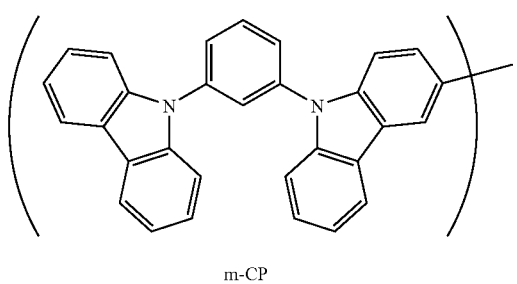

m-CP

[Chemical formula 4]

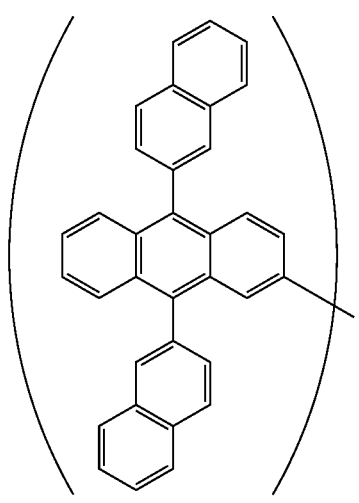

DNA

In addition, the functional group exhibiting both of the electron transport property and the hole transport property may have a structure represented by the following chemical formula.

[Chemical formula 5]

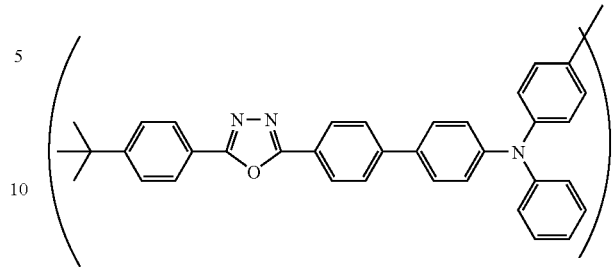

As the functional group exhibiting both of the electron transport property and the hole transport property, an aryl group containing six to sixteen substituted or unsubstituted carbons may be used. The aryl group containing six to sixteen substituted or unsubstituted carbons is the same as or similar to the aryl groups each containing six to sixteen substituted or unsubstituted carbons, which are used as the functional group exhibiting the hole transport property and as the functional group exhibiting the electron transport property.

As the reactive silicon described in the item (2), a compound having a skeleton represented by the following chemical formula may be used.

[Chemical formula 6]

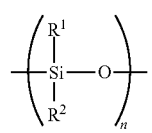

In chemical formula 6, n is an integer of two or more; and each of $R^1$ and $R^2$ is an alkyl group, an alkenyl group, an aryl group, or a cyanoalkyl group, contains one to ten substituted or unsubstituted carbons. Each of the groups $R^1$ and $R^2$ contains vinyl, phenyl, and phenyl halide. The mole fraction of the total of the vinyl, phenyl, and phenyl halide is 40% or less. In addition, each of the groups $R^1$ and $R^2$ preferably includes a methyl group. The mole fraction of the methyl group is preferably 60% or more. Each group represented by $R^1$ and $R^2$ has a reactive group at a terminal chain or side chain. The reactive group is, for example, at least one hydroxyl group included in a molecular chain.

The silane coupling agent may have a charge transport property. When Y in the formula described in the item (1) represents any one of the functional group that is directly bonded to the silicon or bonded to the silicon through the vinyl group or the phenyl group and exhibits the hole transport property, the functional group that is directly bonded to the silicon or bonded to the silicon through the vinyl group or the phenyl group and exhibits the electron transport property, and the functional group that is directly bonded to the silicon or bonded to the silicon through the vinyl group or the phenyl group and exhibits both of the electron transport property and the hole transport property, the silane coupling agent having the charge transport property can be obtained.

(Solvent)

A solvent that can be used for the coating liquid for formation of the light emitting layer according to the present example is not limited as long as the solvent can be mixed with the quantum dot having the silane coupling agent attached to the surface thereof and does not affect white turbidity and the like. As the solvent, an aromatic hydrocarbon solvent, an aromatic heterocyclic compound solvent, an aliphatic hydrocarbon solvent and the like may be used. The aromatic hydrocarbon solvent is xylene, toluene, cyclohexylbenzene, dihydrobenzofuran, trimethylbenzene, tetramethylbenzene or the like. The aromatic heterocyclic compound solvent is pyridine, pyrazine, furan, pyrrole, thiophene, methylpyrrolidone, or the like. The aliphatic hydrocarbon solvent is hexane, pentane, heptane, cyclohexane, or the like. Each of these solvents may be solely used as the solvent that can be used for the coating liquid for formation of the light emitting layer according to the present example. Alternatively, each of these solvents may be mixed with a different one or more of the solvents, and the mixture may be used as the solvent that can be used for the coating liquid for formation of the light emitting layer according to the present example.

(Others)

The coating liquid for formation of the light emitting layer according to the present example may contain an organosilicon compound (such as dimethylpolysiloxane) that does not undergo a cross-linking reaction and is stable.

In the present example, in order to form a light emitting layer capable of emitting light of three primary colors (red, green, and blue), a coating liquid for each of red, green, and blue colors is used. As described above, the quantum dot exhibits an emission spectrum that varies depending on the diameter of the quantum dot. The diameter of the quantum dot is adjusted depending on the color of light to be emitted.

(ii) Method for Forming Light Emitting Layer

In the present example, the coating liquid for formation of the light emitting layer is coated on the substrate having the patterned photoresist layer and cured to form the light emitting layer.

Examples of the method for coating the coating liquid for formation of the light emitting layer include: a spin coating method; an ink jet method; a casting method; an LB method; a dispenser method; a micro gravure coating method; a gravure coating method; a bar coating method; a roll coating method; a wire bar coating method; a dip coating method; a blade coating method; a spray coating method; a flexographic printing method; an offset printing method; a screen printing method; a gravure printing method; and the like.

After the coating liquid for formation of the light emitting layer is coated, a coating film formed by the coating is dehydrated. The method for the dehydration is not limited as long as a uniform light emitting layer can be formed. A hotplate, an infrared light heater, an oven, and the like may be used for the dehydration. The dehydration promotes condensation reaction of the hydrolyzed silane coupling agent to cure the light emitting layer.

The thickness of the light emitting layer is not limited as long as the light emitting layer allows an electron and a hole to be recombined with each other and is capable of emitting light. The thickness of the light emitting layer is in a range of 1 nm to 500 nm, for example.

(2) Second Example

In the process of forming the light emitting layer according to the second example, the coating liquid (for formation of the light emitting layer) that contains the quantum dot having the silane coupling agent attached to the surface thereof and contains at least one of the hole transport material and an electron transport material is coated on the substrate having the patterned photoresist layer and cured to form the single light emitting layer.

In the second example, the light emitting layer has not only a function for emitting light but also at least one of a function for transporting a hole and a function for transporting an electron. The process of manufacturing the EL element can therefore be simplified. In addition, The EL element according to the second example is capable of transporting a charge to the light emitting layer and efficiently transferring energy of an exciton generated by recombination of a hole and an electron. The life characteristics of the EL element can therefore be improved.

The method for forming the light emitting layer according to the second example is the same as that according to the first example, and description thereof is omitted. The coating liquid for formation of the light emitting layer will be described below.

(i) Coating Liquid for Formation of Light Emitting Layer

The coating liquid for formation of the light emitting layer according to the present example contains the quantum dot having the silane coupling agent attached to the surface thereof and contains at least one of the hole transport material or the electron transport material. The coating liquid is typically formed by dispersing or dissolving, in the solvent, the quantum dot having the silane coupling agent attached to the surface thereof and at least one of the hole transport material and the electron transport material.

The coating liquid (according to the second example) for formation of the light emitting layer is not limited as long as the coating liquid contains the quantum dot having the silane coupling agent attached to the surface thereof and contains at least one of the hole transport material and the electron transport material. However, the coating liquid preferably contains the quantum dot having the silane coupling agent attached to the surface thereof and contains both of the hole transport material and the electron transport material. In this case, the EL element is capable of transporting a charge to the quantum dot and efficiently transferring energy of an exciton generated by recombination of a hole and an electron.

The silane coupling agent used in the second example is the same as that used in the first example, and description thereof is omitted. Other structures of the coating liquid for formation of the light emitting layer will be described below.

(Quantum Dot)

When the total solid content of the coating liquid for formation of the light emitting layer is regarded as 100 weight percent, the content of the quantum dots having the silane coupling agent attached to the surfaces thereof in the coating liquid for formation of the light emitting layer is preferably in a range of 10 weight percent to 90 weight percent, more preferably in a range of 30 weight percent to 70 weight percent. When the content of the quantum dots is excessively low, light may not be sufficiently emitted and the light emitting layer may not be sufficiently cured. When the content of the quantum dots is excessively high, it may be difficult to form the light emitting layer and cause the light emitting layer to have the hole transport function, the electron transport function and the like.

Other features of the quantum dot used in the second example are the same as those of the quantum dot used in the first example, and description thereof is omitted.

(Hole Transport Material)

As the hole transport material used in the present example, an arylamine derivative, an anthracene derivative, a carbazole derivative, a thiophene derivative, a fluorene derivative, a distyrylbenzene derivative, a spiro compound, and the like may be used. Specifically, 4,4'-bis[N-(1-naphthyl)-N-phenylamino]-biphenyl($\alpha$-NPD), N,N'-bis-(3-methylphenyl)-N,N'-bis-(phenyl)-benzidine(TPD), 4,4',4''-tris[N-(3-methylphenyl)-N-phenyl-amino]-triphenylamine(MTDATA), 9,10-di-2-naphthylanthracene(DNA), 4,4-N,N'-dicarbazole-biphenyl(CBP), 1,4-bis(2,2-diphenylvinyl)benzene (DPVBi), and the like may be used as the hole transport material used in the present example. Each of these materials may be solely used as the hole transport material used in the present example. Alternatively, each of these materials may be mixed with a different one or more of the materials, and the mixture may be used as the hole transport material used in the present example.

When the coating liquid for formation of the light emitting layer contains the hole transport material and the quantum dot having the silane coupling agent attached to the surface thereof, the preferred ratio of the quantum dot having the silane coupling agent attached to the surface thereof to the hole transport material is 1:0.1 to approximately 1:2. When the ratio of the quantum dot to the hole transport material is excessively low, light may not be sufficiently emitted. When the ratio of the quantum dot to the hole transport material is excessively high, it may be difficult to form the light emitting layer or to cause the light emitting layer to have the hole transport function.

(Electron Transport Material)

As the electron transport material used in the present example, a phenanthroline derivative, a triazole derivative, an oxadiazole derivative, an aluminum quinolinol complex and the like may be used. The phenanthroline derivative is bathocuprone(BCP), bathophenanthroline(Bpehn), or the like. The aluminum quinolinol complex is a tris(8-quinolinol)aluminum complex(Alq3) or the like.

When the coating liquid for formation of the light emitting layer contains the electron transport material and the quantum dot having the silane coupling agent attached to the surface thereof, the preferred ratio of the quantum dot having the silane coupling agent attached to the surface thereof to the electron transport material is 1:0.1 to approximately 1:2. When the ratio of the quantum dot to the electron transport material is excessively low, light may not be sufficiently emitted. When the ratio of the quantum dot to the electron transport material is excessively high, it may be difficult to form the light emitting layer or to cause the light emitting layer to have the electron transport function.

When the coating liquid for formation of the light emitting layer contains the hole transport material, the electron transport material and the quantum dot having the silane coupling agent attached to the surface thereof, the preferred ratio of the quantum dot having the silane coupling agent attached to the surface thereof to the hole transport material and to the electron transport material is 1:0.1:0.1 to approximately 1:2:2. When the ratio of the quantum dot to the hole transport material and to the electron transport material is excessively low, light may not be sufficiently emitted. When the ratio of the quantum dot to the hole transport material and to the electron transport material is excessively high, it may be difficult to form the light emitting layer or to cause the light emitting layer to have the electron transport function and the hole transport function.

(Solvent)

The solvent that can be used for the coating liquid for formation of the light emitting layer and is used in the present example is preferably a non-polar solvent. As the non-polar solvent, an aromatic hydrocarbon solvent, an aromatic heterocyclic compound solvent, an aliphatic hydrocarbon solvent and the like may be used. The aromatic hydrocarbon solvent is xylene, toluene, cyclohexylbenzene, dihydrobenzofuran, trimethylbenzene, tetramethylbenzene or the like. The aromatic heterocyclic compound solvent is pyridine, pyrazine, furan, pyrrole, thiophene, methylpyrrolidone or the like. The aliphatic hydrocarbon solvent is hexane, pentane, heptane, cyclohexane or the like. Each of these solvents may be solely used as the solvent used in the present example. Alternatively, each of these solvents may be mixed with a different one or more of the solvents, and the mixture may be used as the solvent used in the present example.

(Others)

The coating liquid for formation of the light emitting layer can be made by dissolving at least one of the hole transport material and the electron transport material in the solvent and dispersing the quantum dots having the silane coupling agent attached to the surfaces thereof in the resultant solution. Other features of the coating liquid for formation of the light emitting layer are the same as those of the coating liquid used in the first example, and the description thereof is omitted.

For the light emitting layer formed by the method (for forming the light emitting layer) according to the present example, refer to JP-A-2005-522005 and the like.

(3) Third Example

In the process of forming the light emitting layer according to the third example, the coating liquid (for formation of the light emitting layer) containing the hole transport material, the solvent, and the quantum dot having the silane coupling agent attached to the surface thereof is used. The coating liquid for formation of the light emitting layer is coated to form a coating film. After that, the hole transport material and the quantum dot having the silane coupling agent attached to the surface thereof are separated from each other while the solvent contained in the coating film is removed to ensure that the hole transport material is located on the side of the first electrode layer and that the quantum dot having the silane coupling agent attached to the surface thereof is located on the side of a top surface of the coating film. The hole transport layer and the light emitting layer are formed in the process of forming the light emitting layer according to the third example.

Figure 3:
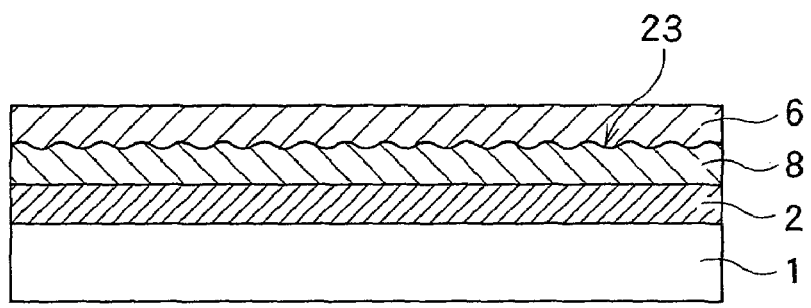
FIG. 3 is a schematic diagram showing an example of a process for forming a light emitting layer in the method for manufacturing an EL element according to the present invention.

In the third example, the coating liquid (for formation of the light emitting layer) containing the hole transport material, the solvent, and the quantum dot having the silane coupling agent attached to the surface thereof is coated on the substrate having the patterned photoresist layer. The hole transport material and the quantum dot having the silane coupling agent attached to the surface thereof are phase-separated from each other (vertical phase separation). As illustrated in FIG. 3, the hole transport layer 8 and the light emitting layer 6 are formed in the single process. In this case, the hole transport layer 8 and the light emitting layer 6 are phase-separated from each other, and a phase separation interface 23 is present between the hole transport layer 8 and the light emitting layer 6.

When the phase separation interface 23 is present between the hole transport layer 8 and the light emitting layer 6, the phase separation interface 23 is substantially parallel to the surface of the first electrode layer 2 when macroscopically observed, as shown in FIG. 3. When microscopically observed, the hole transport layer 8 and the light emitting layer 6 overlap each other in an irregular manner. Therefore, the area of the contact between the hole transport layer 8 and the light emitting layer 6 is large, and a site of recombination of an electron and a hole is large. The site of the recombination is located in a region separated from the first electrode layer. As a result, a site for light emission is large (the number of molecules that contribute to the light emission is increased). It is therefore possible to improve the light emission efficiency and increase the life of the EL element. The interface between the hole transport layer and the light emitting layer is not flat (and is irregular). Therefore, even when a drive voltage is increased, the EL element according to the present example can prevent a hole and an electron from being excited and combined, and prevent the intensity of emitted light from rapidly increasing. Luminance of the emitted light can be gradually increased based on the drive voltage. The luminance of the emitted light can be easily controlled. In addition, even when the emitted light has low luminance, the tone of the emitted light can be easily controlled. In the present example, a complicated peripheral circuit for finely adjusting the drive voltage is not required.

Next, a description will be made of the coating liquid for formation of the light emitting layer and the method for forming the light emitting layer.

(i) Coating Liquid for Formation of Light Emitting Layer

The coating liquid for formation of the light emitting layer, which is used in the present example, contains the hole transport material, the solvent, and the quantum dot having the silane coupling agent attached to the surface thereof. The quantum dot and the silane coupling agent are the same as those described in the first example, and description thereof is omitted. The hole transport material and the solvent are the same as those described in the second example, and description thereof is omitted.

In the present example, when the total solid content of the coating liquid for formation of the light emitting layer is regarded as 100 weight percent, the content of the quantum dots having the silane coupling agent attached to the surfaces thereof in the coating liquid for formation of the light emitting layer is preferably in a range of 10 weight percent to 90 weight percent, more preferably in a range of 30 weight percent to 70 weight percent. When the content of the quantum dots is excessively low, light may not be sufficiently emitted. When the content of the quantum dots is excessively high, it may be difficult to phase-separate the hole transport material and the quantum dot having the silane coupling agent attached to the surface thereof.

The preferred ratio of the quantum dots (contained in the coating liquid for formation of the light emitting layer) having the silane coupling agent attached to the surfaces thereof to the hole transport material (contained in the coating liquid for formation of the light emitting layer) is 1:0.1 to approximately 1:2. When the ratio of the quantum dots having the silane coupling agent attached to the surfaces thereof to the hole transport material is excessively low, light may not be sufficiently emitted. When the ratio of the quantum dots having the silane coupling agent attached to the surfaces thereof to the hole transport material is excessively high, it may be difficult to phase-separate the hole transport material and the quantum dot having the silane coupling agent attached to the surface thereof.

The coating liquid for formation of the light emitting layer, which is used in the present example, can be made by dissolving the hole transport material in the solvent and dispersing the quantum dots having the silane coupling agent attached to the surfaces thereof in the resultant resolution. Other features of the coating liquid for formation of the light emitting layer are the same as those of the coating liquid (for formation of the light emitting layer) used in the first example.

(ii) Method for Forming Light Emitting Layer

In the present example, the coating liquid for formation of the light emitting layer is coated on the substrate having the patterned photoresist layer to form the coating film. After that, the hole transport material and the quantum dot having the silane coupling agent attached to the surface thereof are separated from each other while the solvent contained in the coating film is removed to ensure that the hole transport material is located on the side of the first electrode layer and that the quantum dot having the silane coupling agent attached to the surface thereof is located on the side of the top surface of the coating film. The hole transport layer and the light emitting layer are formed in the process of forming the light emitting layer according to the present example.

The method for coating the coating liquid for formation of the light emitting layer is the same as that according to the first example, and description thereof is omitted.

Figure 4:
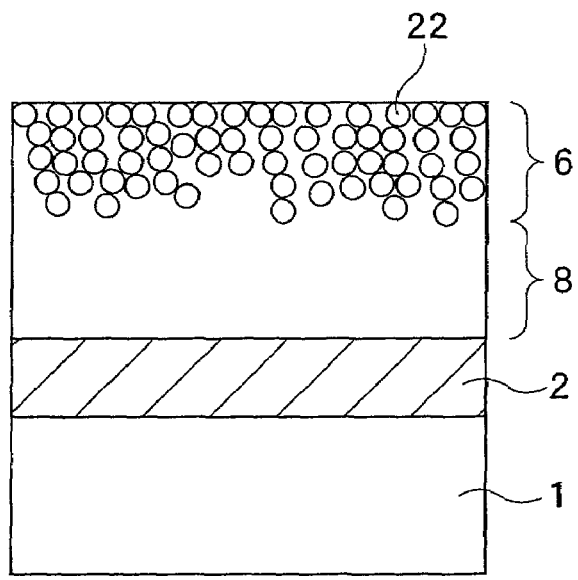
FIG. 4 is a schematic diagram showing phase separation between a hole transport layer and the light emitting layer in the method for manufacturing an EL element according to the present invention.

After the coating liquid for formation of the light emitting layer is coated to form the coating film, the solvent is removed from the coating film. After the solvent is removed, the hole transport material (not shown in FIG. 4) and the quantum dots 22 having the silane coupling agent (not shown in FIG. 4) attached to the surfaces thereof are separated from each other in a vertical direction. The hole transport material is located on the side of the first electrode layer 2, while the quantum dots 22 having the silane coupling agent attached to the surfaces thereof are located on the side of the top surface of the coating film. The coating film becomes solidified. In this way, the hole transport layer 8 and the light emitting layer 6 are formed in the single process. That is, the hole transport layer 8 and the light emitting layer 6 are formed due to the phase separation.

In this case, the state of the phase separation of the hole transport material and the quantum dots having the silane coupling agent attached to the surfaces thereof can be controlled by setting at least one of conditions including the type of the solvent; the weight average molecular weight of the hole transport material; the content of the hole transport material contained in the coating liquid for formation of the light emitting layer; the contents of the quantum dots and the silane coupling agent, which are contained in the coating liquid for formation of the light emitting layer; the rate of removing the solvent; an atmosphere during the removal of the solvent; and the state of the surface of the foundation layer on which the coating liquid for formation of the light emitting layer is coated.

For example, the atmosphere during the removal of the solvent may be an atmosphere containing vapor of a polar solvent. Due to the atmosphere containing the vapor of the polar solvent, the quantum dots having the silane coupling agent attached to the surfaces thereof can be reliably collected on the top side of the coating film. As the polar solvent, water and alcohol such as methanol, ethanol, and isopropanol may be used.

After the coating liquid for formation of the light emitting layer is coated, the coating film is dehydrated. The dehydration promotes condensation reaction of the hydrolyzed silane coupling agent to cure the light emitting layer. The method for the dehydration is the same as that according to the first example, and description thereof is omitted.

The thickness of the light emitting layer is not limited as long as the light emitting layer allows an electron and a hole to be recombined with each other and is capable of emitting light. The thickness of the light emitting layer is in a range of 1 nm to 500 nm, for example.

4. Process of Patterning Light Emitting Layer

In the process of patterning the light emitting layer, the remaining photoresist layer is removed to lift off a portion of the light emitting layer, which is present on the photoresist layer.

In the method for removing the photoresist layer, the photoresist layer may be exposed and developed when the positive photoresist is used.

Examples of the method for exposing the photoresist layer include, a method for exposing the photoresist layer through a photomask, a laser lithography method, a method for exposing the photoresist layer from the side of the substrate, and the like may be used.

The method for the development is the same as that described in the item "2. Process of patterning photoresist layer", and description thereof is omitted.

5. Process of Forming Hole Injection Transport Layer

In the present embodiment, the process of forming a hole injection transport layer on the substrate having the first electrode layer formed thereon may be performed before the process of forming the photoresist layer. The hole injection transport layer stabilizes injection of holes into the light emitting layer and facilitates transportation of the holes. This results in an improvement in the light emission efficiency.

The hole injection transport layer may be a hole injection layer having a hole injection function capable of causing holes injected from the anode to be stably injected into the light emitting layer, or may be a hole transport layer having a hole transport function capable of transporting holes injected from the anode into the light emitting layer. Alternatively, the hole injection transport layer may be formed by laminating the hole injection layer and the hole transport layer or may be a single layer having both of the hole injection function and the hole transport function.

In the process of forming the light emitting layer, when the coating liquid (for formation of the light emitting layer) containing the hole transport material and the quantum dot having the silane coupling agent attached to the surface thereof is used to form the single light emitting layer, or when the hole transport layer and the light emitting layer are formed in the single process, the hole injection layer is preferably formed as the hole injection transport layer.

A hole injection material used for the hole injection layer is not limited as long as the hole injection material is capable of stabilizing the injection of holes into the light emitting layer. As the hole injection material, phenylamines; starburst amines; phthalocyanines; oxides such as a vanadium oxide, a molybdenum oxide, a ruthenium oxide, and an aluminum oxide; amorphous carbon; polyaniline; polythiophene; polyphenylenevinylene; and conductive polymers such as derivatives of the abovementioned materials may be used. The conductive polymers may be doped by an acid. Specifically, 4,4'-bis[N-(1-naphthyl)-N-phenyl-amino]-biphenyl(α-NPD), 4,4',4"-tris(N,N-diphenyl-amino)-triphenylamine (TDATA), 4,4',4"-tris[N-(3-methyl phenyl)-N-phenyl-amino]-triphenylamine(MTDATA), polyvinylcarbazole, poly(3,4-ethylenedioxythiophene)/polystyrene sulfonic acid (PEDOT/PSS), and the like may be used as the hole injection material. Each of these materials may be solely used. Alternatively, each of these materials may be mixed with a different one or more of the materials, and the mixture may be used as the hole injection material.

The thickness of the hole injection layer is not limited as long as a function of the hole injection layer is sufficiently ensured. The thickness of the hole injection layer is preferably in a range of 5 nm to 200 nm, more preferably in a range of 10 nm to 100 nm.

A hole transport material used for the hole transport layer is not limited as long as the hole transport material is capable of stably transporting injected holes into the light emitting layer. As the hole transport material, the hole transport material described in the item "3. Process of forming light emitting layer" may be used.

The thickness of the hole transport layer is not limited as long as a function of the hole transport layer is sufficiently ensured. The thickness of the hole transport layer is preferably in a range of 5 nm to 200 nm, more preferably in a range of 10 nm to 100 nm.

In the process of forming the hole injection transport layer, it is preferable that the hole injection transport layer be formed to ensure that the hole injection transport layer be insoluble in the solvent contained in the coating liquid for formation of the light emitting layer. In the process of forming the light emitting layer on the hole injection transport layer, even when the solvent contained in the coating liquid for formation of the light emitting layer contacts the hole injection transport layer, the hole injection transport layer is not dissolved. The light emitting layer can therefore be stably laminated. In addition, it is possible to suppress a reduction in characteristics of the hole injection transport layer.

In order to make the hole injection transport layer insoluble in the solvent contained in the coating liquid for formation of the light emitting layer, a photoinitiator or the like may be included in the hole injection transport layer. For example, a photoinitiator described in Applied Physics Letters, Vol 81, (2002) or the like may be mixed with a conductive polymer, and the mixture may be irradiated with ultraviolet light and cured.

A curable binder or a material of which solubility is changed by the action of heat energy or the action of radiation are preferably used for the hole injection transport layer to make the hole injection transport layer insoluble in the solvent contained in the coating liquid for formation of the light emitting layer. It is, therefore, preferable that a coating liquid for formation of the hole injection transport layer contain the hole injection material or the hole transport material and the like and contain the curable binder or the material of which the solubility is changed by the action of heat energy or the action of radiation.

Especially, it is preferable that the coating liquid (for formation of the hole injection transport layer) containing the hole injection material or the hole transport material and the like and containing the curable binder be coated and cured to form the hole injection transport layer.

Next, descriptions will be made of the case where the coating liquid (for formation of the hole injection transport layer) containing the hole injection material or the hole transport material and the like and containing the curable binder is coated and cured to form the hole injection transport layer (fourth example), and the case where the coating liquid (for formation of the hole injection transport layer) containing the material of which the solubility is changed by the action of heat energy or the action of radiation is coated, and receives heat energy or is exposed to radiation to form the hole injection transport layer (fifth example).

(1) Fourth Example

In the process of forming the hole injection transport layer according to the fourth example, the coating liquid (for formation of the hole injection transport layer) containing the hole injection material or the hole transport material and the like and containing the curable binder is coated and cured to form the hole injection transport layer. It should be noted that the hole injection material and the hole transport material are described above.

In the process of forming the hole injection transport layer according to the present example, it is preferable that the coating liquid (for formation of the hole injection layer) containing the hole injection material and the curable binder be coated and cured to form the hole injection layer.

It is preferable that the curable binder used in the present example be a material capable of being cured by the action of heat energy or the action of radiation. A sol gel reaction solution, light-curable resin, and heat-curable resin may be used as the curable binder. The sol gel reaction solution turns into a gel after being cured.

The curable binder preferably contains organopolysiloxane. As the organopolysiloxane, a material described in JP-A-2000-249821 and the like may be used.

The coating liquid for formation of the hole injection transport layer can be made by dispersing or dissolving the hole injection material or the hole transport material and the like and the curable binder in a solvent contained in the coating liquid for formation of the hole injection transport layer. When the curable binder contains the organopolysiloxane, alcohol such as ethanol and isopropanol is preferably used as the solvent contained in the coating liquid for formation of the hole injection transport layer.

As the method for coating the coating liquid for formation of the hole injection transport layer, a spin coating method, a spray coating method, a dip coating method, a roll coating method, a bead coating method, or the like may be used.

After the coating liquid for formation of the hole injection transport layer is coated, the coating liquid for formation of the hole injection transport layer is cured. The coating liquid for formation of the hole injection transport layer may receive heat energy or be exposed to radiation to be cured.

The hole injection transport layer may be or may not be patterned. It is determined whether or not the hole injection transport layer is patterned based on the types of the hole injection material, the hole transport material and the like. When conductivity of the hole injection material, the hole transport material and the like is high, it is preferable that the hole injection transport layer be patterned to maintain diode characteristics of the EL element and prevent crosstalk. On the other hand, when resistance of the hole injection material, the hole transport material and the like is high, the hole injection transport layer may be patterned or may not be patterned.

(2) Fifth Example

In the process of forming the hole injection transport layer according to the fifth example, the coating liquid (for formation of the hole injection transport layer) containing the material of which the solubility is changed by the action of heat energy or the action of radiation is coated, and receives heat energy or is exposed to radiation to form the hole injection transport layer.

The change in the solubility of the material means a change in the polarity of the solvent in which a main component of the material is dissolved or dispersed. When the layer containing the material of which the solubility is changed by the action of heat energy or the action of radiation receives heat energy or is exposed to radiation to change the solubility of the material, the polarity of the solvent contained in the coating liquid for formation of the hole injection transport layer is different from the polarity of a solvent in which the hole injection transport layer obtained after the reception of heat energy or the exposure to the radiation is dissolved.

The degree of the change in the solubility of the material is set to ensure that the hole injection transport layer obtained after the reception of heat energy or the exposure to the radiation is not essentially dissolved in and mixed with the solvent used for the coating liquid for formation of the hole injection transport layer. Specifically, the hole injection transport layer obtained after the reception of heat energy or the exposure to the radiation is insoluble in the coating liquid for formation of the hole injection transport layer.

As the material of which the solubility is changed by the action of heat energy or the action of radiation and which is used in the present example, it is preferable to use a hydrophilic organic material in which a part or all of hydrophilic groups are replaced with lipophilic groups and the part or all of the lipophilic groups are returned to the hydrophilic groups under the effect of heat energy or radiation.

In the abovementioned material, it is not necessary that all the hydrophilic groups contained in the hydrophilic organic material be replaced with the lipophilic groups. The ratio of the hydrophilic groups replaced with the lipophilic groups to all the hydrophilic groups is set to ensure that the material exhibits desired solubility in a typical nonaqueous organic solvent. Specifically, it is preferable that the hydrophilic groups be replaced with the lipophilic groups to ensure that the hydrophilic organic material, which is dissolved or dispersed in water and an alcohol solvent, can be dissolved by 0.5 weight percent or more in a typical nonaqueous solvent such as toluene, xylene, acetic ether, and cyclohexanone.

In the abovementioned material, it is not necessary that all the lipophilic groups be returned to the hydrophilic groups. The ratio of the lipophilic groups returned to the hydrophilic groups to all the lipophilic groups is set to ensure that the hole injection transport layer is not dissolved in the solvent contained in the coating liquid for formation of the light emitting layer. Specifically, it is preferable that the lipophilic groups be returned to the hydrophilic groups to ensure that the material, which is dissolved by 0.5 weight percent or more in a typical nonaqueous solvent such as toluene, xylene, acetic ether, and cyclohexanone, is insoluble or has low solubility in toluene, xylene, acetic ether, cyclohexanone, and the like. In this case, it is not necessary that all the lipophilic groups be returned to the hydrophilic groups.

The hydrophilic organic material is not limited as long as the material contains a hydrophilic group, is dispersed or dissolved in water, and has a function required for the hole injection transport layer. When the hole injection transport layer is the hole injection layer, a material described in JP-A-2006-318876 may be used as the hydrophilic organic material.

In the method for replacing the hydrophilic group(s) contained in the hydrophilic organic material with the lipophilic group(s), it is preferable to use a protection reaction since a part or all of the lipophilic groups are returned to the hydrophilic groups by the action of heat energy or the action of radiation. In the protection reaction, the hydrophilic group is derivatized to cause a protective group to be temporarily introduced into the hydrophilic group. As the protection reaction, a protection reaction described in JP-A-2006-318876 may be used.

The coating liquid for formation of the hole injection transport layer can be made by dispersing or dissolving, in the solvent, the hydrophilic organic material having the lipophilic groups changed from a part or all of the hydrophilic groups. In this case, a solvent in which a lipophilic material can be dispersed or dissolved is used as the solvent used for the coating liquid for formation of the hole injection transport layer. As the solvent in which a lipophilic material can be dispersed or dissolved, a solvent described in JP-A-2006-318876 and the like may be used. The content of the hydrophilic organic material (in the coating liquid for formation of the hole injection transport layer) in which a part or all of the hydrophilic groups are replaced with the lipophilic groups varies depending on the component(s) or composition of the material. However, the content of the hydrophilic organic material (in the coating liquid for formation of the hole injection transport layer) is typically set to 0.1 weight percent or more, preferably in a range of approximately 1 weight percent to 5 weight percent.

The hole injection transport layer can be formed by supplying heat energy to the coating film obtained by coating the coating liquid for formation of the hole injection transport layer or applying radiation to the coating film to change solubility of the coating film. After the coating liquid for formation of the hole injection transport layer is coated, the coating liquid may be dehydrated. The supply of the heat energy or the application of the radiation may be performed under conditions described in JP-A-2006-318876. The mechanism of changing the solubility of the material by the action of heat energy or the action of radiation is described in JP-A-2006-318876 in detail.

The hole injection transport layer may be patterned or may not be patterned. It is determined whether or not the hole injection transport layer is patterned based on the type of the hole injection material. When the hole injection material has high conductivity, it is preferable that the hole injection transport layer be patterned to maintain diode characteristics of the EL element and prevent crosstalk. On the other hand, when resistance of the hole injection material is high, the hole injection transport layer may be patterned or may not be patterned.

6. Process of Forming Electron Injection Transport Layer

In the present embodiment, the process of forming an electron injection transport layer on the light emitting layer may be performed after the process of patterning the light emitting layer. The electron injection transport layer stabilizes injection of electrons into the light emitting layer and facilitates transportation of the electrons. This results in an improvement in the light emission efficiency.

The electron injection transport layer may be an electron injection layer having an electron injection function capable of causing electrons injected from the cathode to be stably injected into the light emitting layer, or may be an electron transport layer having an electron transport function capable of transporting electrons injected from the cathode into the light emitting layer. Alternatively, the electron injection transport layer may be formed by laminating the electron injection layer and the electron transport layer, or may be a single layer having both of the electron injection function and the electron transport function.

It is preferable that the electron injection layer be formed as the electron injection transport layer when the coating liquid (for formation of the light emitting layer) containing the electron transport material and the quantum dot having the silane coupling agent attached to the surface thereof is used to form the single light emitting layer in the process of forming the light emitting layer.

An electron injection material used for the electron injection layer is not limited as long as the electron injection material stabilizes the injection of electrons into the light emitting layer. As the electron injection material, the following materials may be used: alkali metals such as Li and Cs or alkaline earth metals such as Ba, Ca, Mg, and Sr; an alkali metal alloy such as an aluminum lithium alloy; oxides of alkali metals or oxides of alkaline earth metals such as a magnesium oxide and a strontium oxide; fluorides of alkali metals or fluorides of alkaline earth metals such as a magnesium fluoride, a calcium fluoride, a strontium fluoride, a barium fluoride, a lithium fluoride, and a cesium fluoride; and organic complexes of alkali metals such as sodium polymethylmethacrylate polystyrene sulfonate. In addition, two or more of the abovementioned materials may be laminated as the electron injection material, such as a layer formed by laminating a Ca layer and an LiF layer.

The thickness of the electron injection layer is not limited as long as a function of the electron injection layer is sufficiently ensured. The thickness of the electron injection layer is preferably in a range of 0.1 nm to 200 nm, more preferably in a range of 0.5 nm to 100 nm.

The electron transport material used for the electron transport layer is not limited as long as the electron transport material is capable of transporting injected electrons into the light emitting layer. For example, the electron transport material described in the item "3. Process of forming light emitting layer" may be used.

The thickness of the electron transport layer is not limited as long as a function of the electron transport layer is sufficiently ensured. The thickness of the electron transport layer is preferably in a range of 1 nm to 100 nm, more preferably in a range of 1 nm to 50 nm.

A material forming the single layer having both of the electron injection function and the electron transport function may be an electron transport material doped by an alkali metal such as Li and Cs or by an alkaline earth metal such as Ba and Sr. The electron transport material may be a phenanthroline derivative such as bathocuprone(BCP) and bathophenanthroline(Bpehn). The preferred mole ratio of the electron transport material to the doping metal is 1:1 to 1:3, more preferably 1:1 to 1:2. The electron transport material doped by the alkali metal or alkaline earth metal has relatively high electron mobility and has higher transmission than that of the metal.

The thickness of the single layer having both of the electron injection function and the electron transport function is not limited as long as a function of the single layer is sufficiently ensured. The thickness of the single layer is preferably in a range of 0.1 nm to 100 nm, more preferably in a range of 0.1 nm to 50 nm.

As the method for forming the electron injection transport layer, a dry process such as a vacuum deposition method or a wet process such as a spin coating method may be performed. According to the present invention, since the light emitting layer is cured, the electron injection transport layer can be stably formed on the light emitting layer even when the wet process is performed.

7. Process of Forming Second Electrode Layer

In the present embodiment, the process of forming the second electrode layer on the light emitting layer is typically performed after the process of patterning the light emitting layer.

The second electrode layer faces the first electrode layer. The second electrode layer may be the anode or the cathode.

A material forming the second electrode layer is not limited as long as the material has conductivity. For example, when the EL element has a structure in which light is output from the side of the second electrode layer, it is preferable that the second electrode layer have transparency. When the EL element has a structure in which light is output from the side of the first electrode layer, it is not necessary that the second electrode layer have transparency. The material having the conductivity is the same as that described in the item "First electrode layer", and description thereof is omitted.

The method for forming the second electrode layer and the method for patterning the second electrode layer are the same as or similar to the method for forming the first electrode layer and the method for patterning the first electrode layer, respectively, and description thereof is omitted.

8. Process of Forming Insulating Layer

In the present embodiment, the process of forming the insulating layer in an opening present between portions of the first electrode layer formed on the substrate may be performed before the process of forming the photoresist layer. The insulating layer serves to prevent conduction between the portions of the first electrode layer and conduction between the first and second electrode layers. A region in which the insulating layer is provided is a non-light emission area.

The insulating layer is formed in the opening present between the portions of the first electrode layer formed on the substrate, and typically covers end portions of the portions of the first electrode layer.

A material forming the insulating layer is not limited as long as the material has an insulation property. Light curing resin, heat curing resin, an inorganic material, and the like may be used as the material forming the insulating layer. The light curing resin is photosensitive polyimide resin, acrylic resin, or the like.

As the method for forming the insulating layer, a typical method such as a photolithography method and a printing method may be used.

9. Other Processes

In the method for manufacturing the EL element according to the present embodiment, the light emitting layer capable of emitting light of at least one color is formed and patterned. When the process of forming the photoresist layer, the process of patterning the photoresist layer, the process of forming the light emitting layer, and the process of patterning the light emitting layer are repeatedly performed, the light emitting layers capable of emitting light of multiple colors can be formed and patterned.

Second Embodiment

According to a second embodiment of the present invention, a method for manufacturing an electroluminescence element having a patterned light emitting layer that is capable of emitting light of an N (which is an integer of two or more) number of colors comprises the steps of: preparing a substrate having a first electrode layer formed thereon; forming a first color photoresist layer on the substrate having the first electrode layer formed thereon; exposing and developing the first color photoresist layer, and patterning the first color photoresist layer to ensure that a portion of the first color photoresist layer, which is located in a first color light emission area, is removed; coating a coating liquid (for formation of a first color light emitting layer portion) containing a first quantum dot having a silane coupling agent attached to the surface thereof on the resultant substrate having the patterned first color photoresist layer, curing the coating liquid for formation of the first color light emitting layer portion to form the first color light emitting layer portion; removing the remaining first color photoresist layer to lift off a part of the first color light emitting layer portion, which is present on the first color photoresist layer; forming a second color photoresist layer on the resultant substrate having the first electrode layer and the patterned first color light emitting layer portion; exposing and developing the second color photoresist layer, and patterning the second color photoresist layer to ensure that a portion of the second color photoresist layer, which is located in a second color light emission area, is removed; coating a coating liquid (for formation of a second color light emitting layer portion) containing a second quantum dot having a silane coupling agent attached to the surface thereof on the resultant substrate having the patterned second color photoresist layer, curing the coating liquid for formation of the second color light emitting layer portion to form the second color light emitting layer portion; and removing the remaining second color photoresist layer to lift off a part of the second color light emitting layer portion, which is present on the second color photoresist layer.

In the method for manufacturing the EL element according to the present embodiment, the first and second color light emitting layer portions are patterned. The light emitting layer capable of emitting light of the first to Nth colors may be patterned in the same manner as the processes for patterning the first and second color light emitting layer portions.

The method for manufacturing the EL element according to the present embodiment will be described with reference to the accompanying drawings.

FIGS. 5(a) to 5(j) and FIGS. 6(a) and 6(i) are process diagrams showing an example of the method for manufacturing the EL element having a patterned light emitting layer capable of emitting light of three colors according to the present embodiment. First, a first electrode layer 2 is formed on a substrate 1 and patterned; an insulating layer 3 is formed between portions of the first electrode layer 2; and a hole injection layer 4 is then formed on the first electrode layer 2 and the insulating layer 3 (in a hole injection layer formation process).

Figure 5:
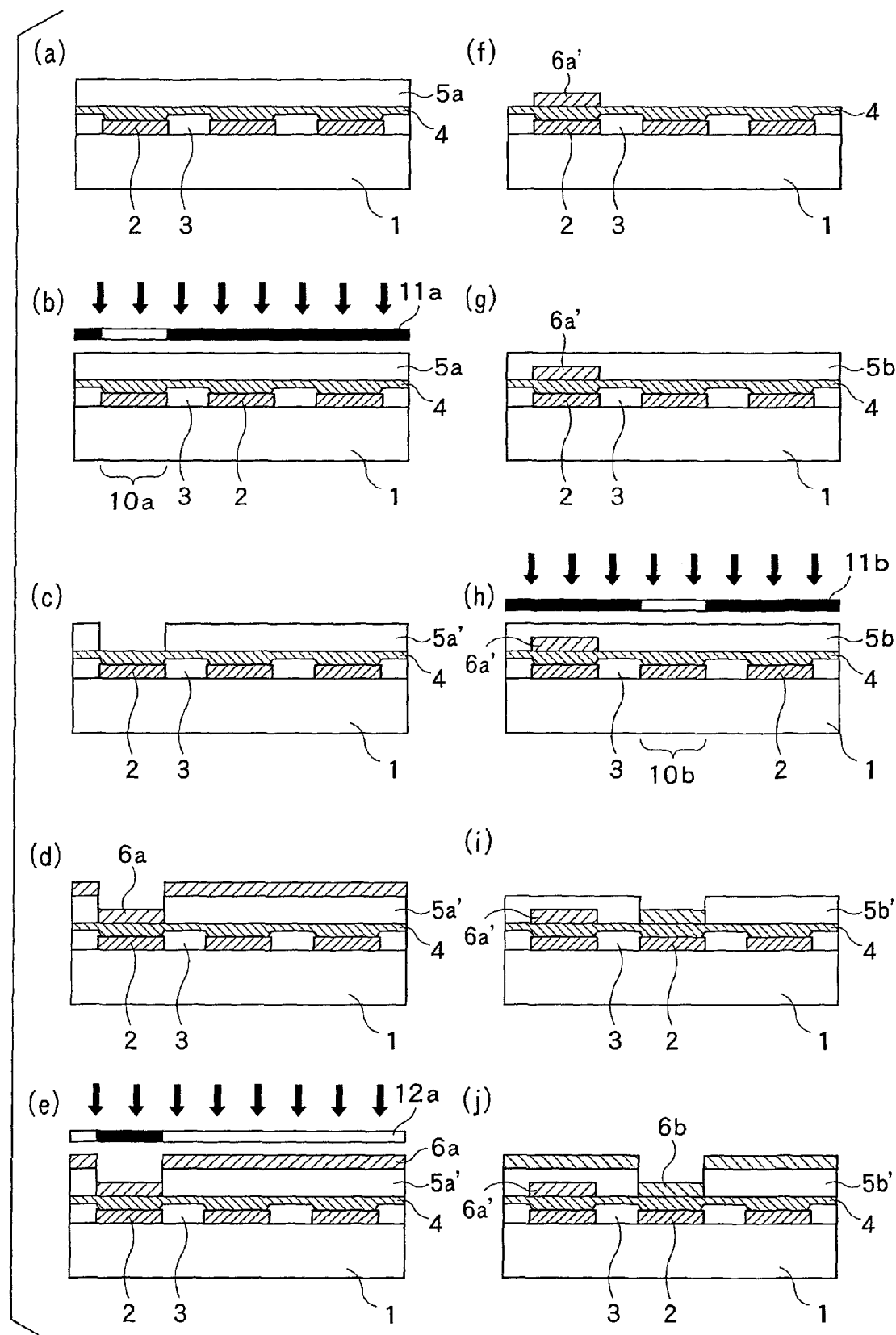
FIGS. 5(a) to 5(j) are process diagrams showing another example of the method for manufacturing an EL element according to the present invention.

Next, a positive photoresist is coated on the hole injection layer 4 to form a first color photoresist layer 5a (in a first color photoresist layer formation process, as shown in FIG. 5(a)). Then, the first color photoresist layer 5a is exposed through a photomask 11a to ensure that a portion of the first color photoresist layer 5a, which is located in a first color light emission area 10a, is removed; the first color photoresist layer 5a is developed by a photoresist developer and cleaned; and the patterned first color photoresist layer 5a' is then formed (in a first color photoresist layer patterning process, as shown in FIGS. 5(b) and 5(c)).

Next, a first coating liquid (for formation of a first color light emitting layer portion 6a) containing a first quantum dot having a silane coupling agent attached to the surface thereof is coated on the hole injection layer 4 and the patterned first color photoresist layer 5a' to form the first color light emitting layer portion 6a (in a first color light emitting layer process, as shown in FIG. 5(d)).

Subsequently, the first color photoresist layer 5a' is exposed through a photomask 12a, developed by a photoresist developer, and cleaned to ensure that the remaining first color photoresist layer 5a' is removed to lift off a part of the first color light emitting layer portion 6a, which is present on the first color photoresist layer 5a'; and the patterned first color light emitting layer portion 6a' is then formed (in a first color light emitting layer patterning process, as shown in FIGS. 5(e) and 5(f)).

Then, a positive photoresist is coated on the hole injection layer 4 and the patterned first color light emitting layer portion 6a' to form a second color photoresist layer 5b (in a second color photoresist layer formation process, as shown in FIG. 5(g)). The second color photoresist layer 5b is exposed through a photomask 11b, developed by a photoresist developer, and cleaned to ensure that a portion of the second color photoresist layer 5b, which is located in a second color light emission area 10b, is removed; and the patterned second color photoresist layer 5b' is then formed (in a second color photoresist layer patterning process, as shown in FIGS. 5(h) and 5(i)).

Next, a second coating liquid (for formation of a second color light emitting layer portion) containing a second quantum dot having a silane coupling agent attached to the surface thereof is coated on the hole injection layer 4 and the patterned second color photoresist layer 5b' to form the second color light emitting layer portion 6b (in a second color light emitting layer formation process, as shown in FIG. 5(j)). Then, the second color photoresist layer 5b' is exposed through a photomask 12b, developed by a photoresist developer, cleaned to ensure that the remaining second color photoresist layer 5b' is removed to lift off a part of the second color light emitting layer portion 6b, which is present on the second color photoresist layer 5b'; and the patterned second color light emitting layer portion 6b' is then formed (in a second color light emitting layer patterning process, as shown in FIGS. 6(a) and 6(b)).

Figure 6:
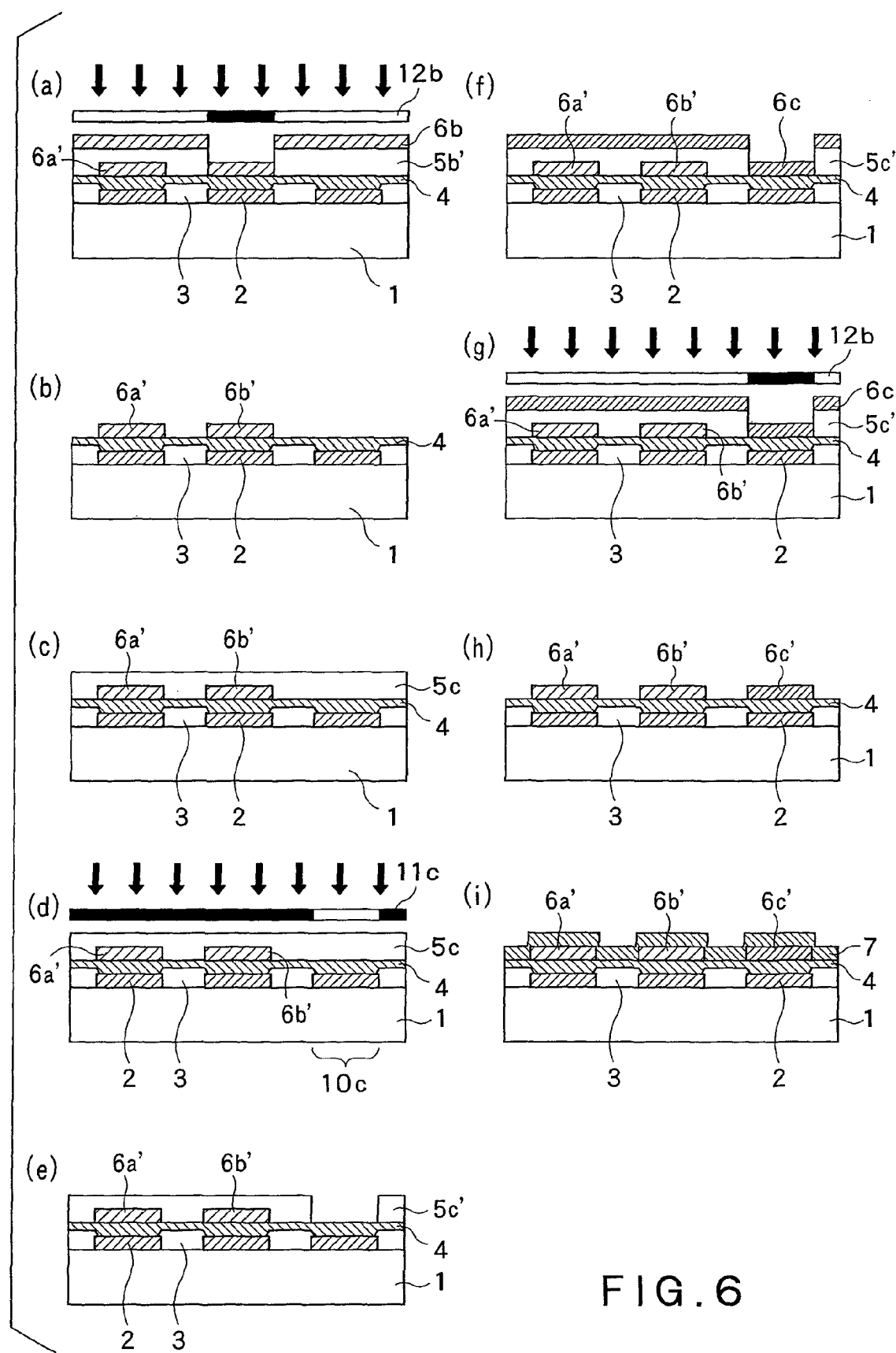
FIGS. 6(a) to 6(i) are process diagrams showing still another example of the method for manufacturing an EL element according to the present invention.

Next, a positive photoresist is coated on the resultant substrate having the patterned first color light emitting layer portion 6a' and the patterned second color light emitting layer portion 6b' to form a third color photoresist layer 5c (in a third color photoresist layer formation process, as shown in FIG. 6(c)). The third color photoresist layer 5c is exposed through a photomask 11c, developed by a photoresist developer, and cleaned to ensure that a portion of the third color photoresist layer 5c, which is located in a third color light emission area 10c, is removed; and the patterned third color photoresist layer 5c' is then formed (in a third color photoresist layer patterning process, as shown in FIGS. 6(d) and 6(e)).

Next, a third coating liquid (for formation of a third color light emitting layer portion) containing a third quantum dot having a silane coupling agent attached to the surface thereof is coated on the hole injection layer 4 and the patterned third color photoresist layer 5c' to form a third color light emitting layer portion 6c (in a third color light emitting layer formation process, as shown in FIG. 6(f)); the third color photoresist layer 5c' is then exposed through a photomask 12c, developed by a photoresist developer, and cleaned to ensure that the remaining third color photoresist layer 5c' is removed to lift off a part of the third color light emitting layer portion 6c, which is present on the third color photoresist layer 5c'; and the third color light emitting layer portion 6c' is then formed (in a third color light emitting layer patterning process, as shown in FIGS. 6(g) and 6(h)).

Lastly, a second electrode layer 7 is formed on the patterned first, second, and third color light emitting layer portions 6a', 6b', and 6c' (in a second electrode layer formation process, as shown in FIG. 6(i)).

According to the present embodiment, the coating liquid (for formation of each of the light emitting layer portions) containing the quantum dot having the silane coupling agent attached to the surface thereof is coated, cured to form the light emitting layer portion. The stability of the quantum dot included in each light emitting layer is excellent, and the life characteristics of the EL element can be improved. In addition, since the molecular design of the silane coupling agent is relatively easy, the life characteristics can be improved by using the silane coupling agent having the functional groups exhibiting various kinds of functionality.

According to the present embodiment, the first coating liquid (for formation of the first color light emitting layer portion) containing the first quantum dot having the silane coupling agent attached to the surface thereof is coated and cured to form the first color light emitting layer portion. Therefore, the photoresist used to pattern the second color light emitting layer portion can be coated on the first color light emitting layer portion to form the second color photoresist layer while the first color light emitting layer portion is not dissolved in a photoresist solvent. In addition, during the patterning of the second color photoresist layer, it is possible to prevent the first color light emitting layer portion from being dissolved in the photoresist developer. Furthermore, during the patterning of the third color photoresist layer, it is possible to prevent the first and second color light emitting layer portions from being dissolved in the photoresist developer. In each of the processes, it is possible to suppress a reduction in characteristics of each of the light emitting layer portions.

Since the coating liquid (for formation of each of the light emitting layer portions) containing the silane coupling agent is used to form the light emitting layer portion, the silane coupling agent included in each light emitting layer portion is coupled to the foundation layers (the first electrode layer, the hole injection layer, etc.) provided under the light emitting layer to improve adhesiveness between the foundation layers and the light emitting layer. The coating liquid (for formation of each of the light emitting layer portions) containing the silane coupling agent allows the light emitting layer to have excellent thermal stability (Tg: glass transition temperature).

In the present embodiment, the lithography method is performed for patterning a light emitting layer portion a plurality of times to form a patterned light emitting layer capable of emitting light of multiple colors. In the processes of forming the first to third color light emitting layer portions, the different types of quantum dots are used in the first to third coating liquids for formation of the first to third color light emitting layer portions. Since a quantum dot exhibits a light emission spectrum varying depending on the diameter of the quantum dot, the diameter of the quantum dot is adjusted based on the color of light to be emitted by each light emitting layer portion.

The first color photoresist layer formation process and the second color photoresist layer formation process are the same as or similar to the photoresist layer formation process described in the first embodiment. The first color photoresist layer patterning process and the second color photoresist layer patterning process are the same as or similar to the photoresist layer patterning process described in the first embodiment. The first color light emitting layer formation process and the second color light emitting layer formation process are the same as or similar to the light emitting layer formation process described in the first embodiment. The first color light emitting layer patterning process and the second color light emitting layer patterning process are the same as or similar to the light emitting layer patterning process described in the first embodiment. A description of these processes is therefore omitted.

The hole injection transport layer formation process, the electron injection transport layer formation process, the insulating layer formation process and the like, which are described in the first embodiment, can be used in the second embodiment. After the process of patterning the light emitting layer capable of emitting light of an N number of colors, the second electrode layer formation process is typically performed in the same manner as in the first embodiment.

The present invention is not limited to the abovementioned embodiments. A structure that is substantially the same as that included in technical ideas described in the claims of the present invention and has a similar effect to the present invention is included in the technical scope of the present invention.

Experimental Examples

A description will be made of the present invention through experimental examples and comparative examples.

Experimental Example 1

(Formation of Hole Injection Layer)

First, a six inch square indium tin oxide (ITO) substrate having a pattern of ITO and having a thickness of 1.1 mm was cleaned. A coating liquid for formation of the hole injection layer was made by adding γ-glycidoxypropyltrimethoxysilane (TSL8350, made by Toshiba Silicon K.K.) (which is used as a silane coupling agent) to aqueous dispersion (Baytron P CH8000, made by Starck) of poly(3,4-ethylenedioxythiophene)/polystyrene sulphonic acid (PEDOT/PSS) to ensure that the content of the silane coupling agent relative to the total solid content was 5 percent. The coating liquid (for formation of the hole injection layer) of 0.5 ml was dropped onto a central portion of the substrate, and spin coating was performed at 2500 rpm for 20 seconds. In this way, the hole injection layer having a thickness of 800 angstroms was formed. The hole injection layer was then dehydrated at a temperature of 150° C. for 10 minutes to be insolubilized.

(Formation of First Color Photoresist Layer)

Next, a positive photoresist (made by Tokyo Ohka Kogyo Co., Ltd., OFPR-800) of 2 ml was dropped onto the central portion of the resultant substrate having the hole injection layer. Spin coating was then performed at 500 rpm for 10 seconds. After that, spin coating was performed at 2000 rpm for 20 seconds. A first color photoresist layer having a thickness of 1 μm was then formed. Subsequently, pre-bake was performed on the photoresist layer at a temperature of 80° C. for 30 minutes. After that, the resultant substrate having the first color photoresist layer and an exposure mask were set to an alignment exposure device to ensure that a portion of the first color photoresist layer, which was located in a first light emission area, was exposed to ultraviolet light. Then, the first color photoresist layer was developed by a photoresist developer (made by Tokyo Ohka Kogyo Co., Ltd., NMD-3) for 20 seconds and cleaned with water. The exposed portion of the first color photoresist layer was removed.

(Formation of First Color Light Emitting Layer Portion)

A silane coupling agent was added to a dispersion liquid (made by Evident Technologies, Inc., Maple-Red Orange) of quantum dots for emitting red light to change a ligand. Specifically, tetramethoxysilane (LS-540, made by Shin-Etsu Chemical Co., Ltd.) of 5 grams, phenyltrimethoxysilane (LS-2750, made by Shin-Etsu Chemical Co., Ltd.) of 1 gram, and HCL 2 grams of 0.01N were stirred at a room temperature for 12 hours to obtain a copolymer compound (silane coupling agent). Toluene was then added to the copolymer compound. The obtained copolymer compound was stirred to dissolve the toluene in the copolymer compound. In this way, a ten weight percent toluene solution of the silane coupling agent was obtained.

The ten weight percent toluene solution (of the silane coupling agent) of 2 grams was dropped into the dispersion liquid (of 1 gram) of the quantum dots at a room temperature (of 26° C.), while the dispersion liquid (of 1 gram) of the quantum dots was stirred under an argon gas atmosphere. This reaction solution was stirred for 12 hours. After that, the argon gas atmosphere was changed to an ambient atmosphere, and toluene with a quantity equal to the amount of evaporated toluene was added to the reaction solution. Ethanol of 8 grams was then dropped into the reaction solution. Then, deposit was separated from the reaction solution by centrifugation. After that, quantum dots protected by the silane coupling agent were generated by redeposit in the following order. That is, the deposit and toluene of 4 grams were mixed with each other to obtain a dispersion liquid; and ethanol of 10 grams was dropped into the dispersion liquid to obtain deposit. A redeposit liquid obtained in this way was separated by centrifugation to obtain quantum dots protected by the silane coupling agent.

Next, the quantum dots protected by the silane coupling agent were dispersed in toluene to make a coating liquid for formation of a red light emitting layer portion.

The coating liquid (for formation of the red light emitting layer portion) of 1 ml was dropped onto the central portion of the resultant substrate having the patterned first color photoresist layer, and spin coating was performed at 2500 rpm for 20 seconds, to form a first color light emitting layer portion. Then, the first color light emitting layer portion was heated at a temperature of 100° C. for 15 minutes to be insolubilized. After that, the substrate having the first color light emitting layer portion and an exposure mask were set to the alignment exposure device to ensure that a portion of the first color photoresist layer other than the portion (of the first color photoresist layer) located in the first color light emission area was exposed to ultraviolet light. Then, the first color photoresist layer was developed by the photoresist developer (made by Tokyo Ohka Kogyo Co., Ltd., NMD-3) for 20 seconds and cleaned with water. The exposed portion of the first color photoresist layer was removed to lift off a part of the first color light emitting layer portion, which is present on the first color photoresist layer.

(Formation of Second Color Photoresist Layer)

Next, the positive photoresist (made by Tokyo Ohka Kogyo Co., Ltd., OFPR-800) of 2 ml was dropped onto the central portion of the resultant substrate having the patterned first color light emitting layer portion, and spin coating was performed at 500 rpm for 10 seconds. After that, spin coating was performed at 2000 rpm for 20 seconds. Then, a second color photoresist layer having a thickness of 1 μm was formed. Pre-bake was performed on the second color photoresist layer at a temperature of 80° C. for 30 minutes. After that, the substrate having the second color photoresist layer and an exposure mask were set to the alignment exposure device to ensure that a portion of the second color photoresist layer, which is located in a second color light emission area, was exposed to ultraviolet light. Then, the second color photoresist layer was developed by the photoresist developer (made by Tokyo Ohka Kogyo Co., Ltd., NMD-3) for 20 seconds and cleaned with water. The exposed portion of the second color photoresist layer was removed.

(Formation of Second Color Light Emitting Layer Portion)

Next, a dispersion liquid (made by Evident Technologies Inc., Adirondack Green) of quantum dots for emitting green light was used to make a coating liquid for formation of a green light emitting layer portion in the same manner as the coating liquid for formation of the red light emitting layer portion.

The coating liquid (for formation of the green light emitting layer portion) of 1 ml was dropped onto the central portion of the resultant substrate having the patterned second color photoresist layer, and spin coating was performed at 2500 rpm for 20 seconds, to form a second color light emitting layer portion. The second color light emitting layer portion was heated at a temperature of 100° C. for 15 minutes to be insolubilized. After that, the substrate having the second color light emitting layer portion and an exposure mask were set to the alignment exposure device to ensure that a portion of the second color photoresist layer other than the portion (of the second color photoresist layer) located in the second color light emission area was exposed to ultraviolet light. Then, the second color photoresist layer was developed by the photoresist developer (made by Tokyo Ohka Kogyo Co., Ltd., NMD-3) for 20 seconds and cleaned with water. The exposed portion of the second color photoresist layer was removed to lift off a part of the second color light emitting layer portion, which is present on the second color photoresist layer.

(Formation of Third Color Photoresist Layer)

Next, the positive photoresist (made by Tokyo Ohka Kogyo Co., Ltd., OFPR-800) of 2 ml was dropped onto the central portion of the resultant substrate having the first and second color light emitting layer portions patterned. Spin coating was then performed at 500 rpm for 10 seconds. After that, spin coating was performed at 2000 rpm for 20 seconds. Then, a third color photoresist layer having a thickness of 1 μm was formed. Pre-bake was then performed on the third color photoresist layer at a temperature of 80° C. for 30 minutes. After that, the substrate having the third color photoresist layer and an exposure mask were set to the alignment exposure device to ensure that a portion of the third color photoresist layer, which is located in a third color light emission area, was exposed to ultraviolet light. Then, the third color photoresist layer was developed by a photoresist developer (made by Tokyo Ohka Kogyo Co., Ltd., NMD-3) for 20 seconds and cleaned with water. The exposed portion of the third color photoresist layer was removed.

(Formation of Third Color Light Emitting Layer Portion)

Next, a dispersion liquid (made by Evident Technologies Inc., Lake Placid Blue) of quantum dots for emitting blue light was used to make a coating liquid for formation of a blue light emitting layer portion in the same manner as the coating liquid for formation of the red light emitting layer portion.

The coating liquid (for formation of the blue light emitting layer portion) of 1 ml was dropped onto the central portion of the resultant substrate having the patterned third color photoresist layer, and spin coating was then performed at 2500 rpm for 20 seconds, to form the third color light emitting layer portion. Then, the third color light emitting layer portion was heated at a temperature of 100° C. for 15 minutes to be insolubilized. The substrate having the third color light emitting layer portion and an exposure mask were set to the alignment exposure device to ensure that a portion of the third color photoresist layer other than the portion (of the third color photoresist layer) located in the third color light emission area was exposed to ultraviolet light. Then, the third color photoresist layer was developed by the photoresist developer (made by Tokyo Ohka Kogyo Co., Ltd., NMD-3) for 20 seconds and cleaned with water. The exposed portion of the third color photoresist layer was removed to lift off a part of the third color light emitting layer portion, which is present on the third color photoresist layer.

(Formation of Electron Injection Transport Layer and Second Electrode Layer)

The substrate having the first to third color light emitting layer portions patterned was dehydrated at a temperature of 100° C. for 1 hour. After that, a film (having a thickness of 30 nm) made of BAlq2 and a film (having a thickness of 20 nm) made of Alq3 were formed by vacuum deposition on these light emitting layer portions in this order to form an electron injection transport layer. A film (having a thickness of 10 angstroms) made of LiF and a film (having a thickness of 100 nm) made of Al were deposited on the electron injection transport layer in this order by means of a metal mask having an opening perpendicular to the ITO pattern to form a second electrode layer. In this way, an EL element was made.

(Evaluation of Light Emission Characteristics of EL Element)

The ITO electrode (first electrode layer) was connected to a positive terminal, and the Al electrode (second electrode layer) was connected to a negative terminal. A source meter applied a direct current to the EL element. When a voltage of 10 volts was applied to the EL element, it was confirmed that the first to third color light emitting layer portions emitted light.

Experimental Example 2

(Formation of First Color Photoresist Layer)

First, a six inch square indium tin oxide (ITO) substrate having a pattern of ITO and having a thickness of 1.1 mm was cleaned. Next, the positive photoresist (made by Tokyo Ohka Kogyo Co., Ltd., OFPR-800) of 2 ml was dropped onto a central portion of the substrate. Then, spin coating was performed at 500 rpm for 10 seconds. After that, spin coating was performed at 2000 rpm for 20 seconds. A first color photoresist layer having a thickness of 1 μm was then formed. Pre-bake was performed on the first color photoresist layer at a temperature of 80° C. for 30 minutes. After that, the substrate having the first color photoresist layer and an exposure mask were set to the alignment exposure device to ensure that a portion of the first color photoresist layer, which is located in a first color light emission area, was exposed to ultraviolet light. Then, the first color photoresist layer was developed by the photoresist developer (made by Tokyo Ohka Kogyo Co., Ltd., NMD-3) for 20 seconds and cleaned with water. The exposed portion of the first color photoresist layer was removed.

(Formation of First Color Light Emitting Layer Portion)

A coating liquid for formation of a red light emitting layer portion was made by dispersing triazole, TPD, and the quantum dots (made by means of the dispersion liquid (made by Evident Technologies Inc., Maple-Red Orange) of quantum dots for emitting red light in the experimental example 1) protected by the silane coupling agent into toluene. In this case, the coating liquid for formation of the red light emitting layer portion contains the quantum dots (protected by the silane coupling agent) of 40 weight percent, the triazole of 30 weight percent, and the TPD of 30 weight percent.

The coating liquid (for formation of the red light emitting layer portion) of 1 ml was dropped onto the central portion of the substrate having the patterned first color photoresist layer, and spin coating was performed at 25000 rpm for 20 seconds, to form a first color light emitting layer having a thickness of 100 nm. Then, the first color light emitting layer portion was heated at a temperature of 100° C. for 15 minutes to be insolubilized. After that, the substrate having the first color light emitting layer portion and an exposure mask were set to the alignment exposure device to ensure that a portion of the first color photoresist layer other than the portion (of the first color photoresist layer) located in the first color light emission area was exposed to ultraviolet light. Then, the first color photoresist layer was developed by the photoresist developer (made by Tokyo Ohka Kogyo Co., Ltd., NMD-3) for 20 seconds and cleaned with water. The exposed portion of the first color photoresist layer was removed to lift off a part of the first color light emitting layer portion, which is present on the first color photoresist layer.

(Formation of Second Color Photoresist Layer)

A second color photoresist layer was formed on the resultant substrate having the patterned first color light emitting layer portion and patterned in the same manner as the formation and patterning of the first color photoresist layer.

(Formation of Second Color Light Emitting Layer Portion)

A coating liquid for formation of a green light emitting layer portion was made by means of quantum dots (made by means of the dispersion liquid (made by Evident Technologies Inc., Adirondack Green) of quantum dots for emitting green light in the experimental example 1) protected by the silane coupling agent in the same manner as the coating liquid for formation of the red light emitting layer portion. A second color light emitting layer portion was formed and patterned by means of the coating liquid for formation of the green light emitting layer portion in the same manner as the formation and patterning of the first color light emitting layer portion.
(Formation of Third Color Photoresist Layer)

A third color photoresist layer was formed and patterned on the resultant substrate having the patterned first and second color light emitting layer portions in the same manner as the formation and patterning of the first color photoresist layer.
(Formation of Third Color Light Emitting Layer)

A coating liquid for formation of a blue light emitting layer portion was made by means of quantum dots (made by means of the dispersion liquid (made by Evident Technologies Inc., Lake Placid Blue) of quantum dots for emitting blue light in the experimental example 1) protected by the silane coupling agent in the same manner as the coating liquid for formation of the red light emitting layer portion. A third color light emitting layer portion was formed by means of the coating liquid for formation of the blue light emitting layer portion and patterned in the same manner as the formation and patterning of the first color light emitting layer portion.
(Formation of Second Electrode Layer)

The resultant substrate having the patterned first to third color light emitting layer portions was dehydrated at a temperature of 100° C. for 1 hour. After that, a film (having a thickness of 100 nm) made of Mg and Ag (the ratio of Mg to Ag is 9:1) and a film (having a thickness of 200 nm) made of Ag were deposited on the light emitting layer portions by means of a metal mask having an opening perpendicular to the ITO pattern to form a second electrode layer. In this way, an EL element was made.
(Evaluation of Light Emission Characteristics of EL Element)

The ITO electrode (first electrode layer) was connected to a positive terminal, and the Ag electrode (second electrode layer) was connected to a negative terminal. A source meter applied a direct current to the EL element. When a voltage of 10 volts was applied to the EL element, it was confirmed that the first to third color light emitting layer portions emitted light.

What is claimed is:

1. A method for manufacturing an electroluminescence element, comprising:
   preparing a substrate having a first electrode layer formed thereon;
   forming a photoresist layer on the substrate having the first electrode layer formed thereon such that the photoresist layer is opposite the substrate with respect to the first electrode layer;
   exposing and developing the photoresist layer and patterning the photoresist layer to ensure that a portion of the photoresist layer, which is located in a light emission area, is removed forming a resultant substrate having a patterned photoresist layer;
   coating a coating liquid on the resultant substrate having the patterned photoresist layer and curing the coating liquid to form a light emitting layer, wherein the coating liquid comprises a quantum dot having a silane coupling agent attached to the surface thereof; and
   removing the patterned photoresist layer to lift off a portion of the light emitting layer, which is present on the patterned photoresist layer.

2. A method for manufacturing an electroluminescence element having a patterned light emitting layer that is capable of emitting light of an N number of colors, where N is an integer of two or more, comprising:
   preparing a substrate having a first electrode layer formed thereon;
   forming a first color photoresist layer on the substrate having the first electrode layer formed thereon such that the first color photoresist layer is opposite the substrate with respect to the first electrode layer;
   exposing and developing the first color photoresist layer and patterning the first color photoresist layer to ensure that a portion of the first color photoresist layer, which is located in a first color light emission area, is removed forming a resultant substrate having a patterned first color photoresist layer;
   coating a first coating liquid on the resultant substrate having the first color photoresist layer patterned and curing the first coating liquid to form a first color light emitting layer portion, wherein the first coating liquid comprises a first quantum dot having a silane coupling agent attached to the surface thereof;
   removing the patterned first color photoresist layer to lift off a part of the first color light emitting layer portion, which is present on the patterned first color photoresist layer, thus forming a resultant substrate having the patterned first electrode layer and a patterned first color light emitting layer portion;
   forming a second color photoresist layer on the resultant substrate having the patterned first electrode layer and the patterned first color light emitting layer portion such that the second color photoresist layer is opposite the substrate with respect to the patterned first electrode layer and the patterned first color light emitting layer portion;
   exposing and developing the second color photoresist layer and patterning the second color photoresist layer to ensure that a portion of the second color photoresist layer, which is located in a second color light emission area, is removed forming a resultant substrate having a patterned second color photoresist layer;
   coating a second coating liquid on the resultant substrate having the patterned second color photoresist layer and curing the second coating liquid to form a second color light emitting layer portion, wherein the second coating liquid comprises a second quantum dot having a silane coupling agent attached to the surface thereof; and
   removing the patterned second color photoresist layer to lift off a part of the second color light emitting layer portion, which is present on the second color photoresist layer.

3. The method according to claim 2, wherein the integer N is three.

4. The method according to claim 2, wherein said coating liquid comprises a hole transport material, a solvent, and the quantum dot having the silane coupling agent attached to the surface thereof, and
   during said forming the first color light emitting layer portion and said forming the second color light emitting layer portion, after said coating liquid is coated to form a coating film, the hole transport material and the quantum dot having the silane coupling agent attached to the surface thereof are separated from each other while the solvent contained in the coating film is removed to ensure that the hole transport material is located on the side of the first electrode layer and that the quantum dot having the silane coupling agent attached to the surface thereof is located on the side of a top surface of the coating film in order to form a hole transport layer and the light emitting layer or the light emitting layer portion.

5. The method according to claim 2, wherein said first coating liquid and said second coating liquid comprise at least one of a hole transport material and an electron transport material.

6. The method according to claim 2, further comprising, before said forming the first and second color photoresist layers, respectively, coating a coating liquid on the substrate having the first electrode layer formed thereon and curing the coating liquid to form a hole injection layer, wherein the coating liquid comprises a hole injection material and a curable binder.

7. The method according to claim 2, wherein the silane coupling agent is a silicon compound represented by:

$$Y_n SiX_{(4-n)},$$

where
Y is selected from the group consisting of an alkyl group, a fluoroalkyl group, a vinyl group, an amino group, a phenyl group, and an epoxy group;
X is selected from the group consisting of an alkoxyl group, an acetyl group, and a halogen group; and
n represents an integer of 0 to 3.

8. The method according to claim 2, wherein the silane coupling agent is a silicon compound represented by:

$$Y_n SiX_{(4-n)},$$

where
Y is selected from the group consisting of a functional group that is directly bonded to the silicon or bonded to the silicon through a vinyl group or a phenyl group and exhibits a hole transport property, a functional group that is directly bonded to the silicon or bonded to the silicon through a vinyl group or a phenyl group and exhibits an electron transport property, and a functional group that is directly bonded to the silicon or bonded to the silicon through a vinyl group or a phenyl group and exhibits both of the hole transport property and the electron transport property;
X is selected from the group consisting of an alkoxyl group, an acetyl group, and a halogen group; and
n represents an integer of 0 to 3.

9. The method according to claim 2, wherein said quantum dot independently has a core and a shell, wherein the core comprises a semiconductor fine particle, the shell surrounds the core and the shell comprises a material having a band gap larger than that of the semiconductor fine particle.

10. The method according to claim 2, wherein said quantum dot comprises semiconductor compound selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe, or a mixture thereof.

11. The method according to claim 4, wherein said hole transport material comprises an arylamine derivative, an anthracene derivative, an carbazole derivative, a thiophene derivative, a fluorene derivative, a distyrylbenzene derivative, and a spiro compound.

12. The method according to claim 1, wherein said coating liquid comprises a hole transport material, a solvent, and the quantum dot having the silane coupling agent attached to the surface thereof, and during said forming the light emitting layer, after said coating liquid is coated to form a coating film, the hole transport material and the quantum dot having the silane coupling agent attached to the surface thereof are separated from each other while the solvent contained in the coating film is removed to ensure that the hole transport material is located on the side of the first electrode layer and that the quantum dot having the silane coupling agent attached to the surface thereof is located on the side of a top surface of the coating film in order to form a hole transport layer and the light emitting layer or the light emitting layer portion.

13. The method according to claim 1, wherein said coating liquid comprises at least one of a hole transport material and an electron transport material.

14. The method according to claim 1, further comprising before said forming the photoresist layer, coating a coating liquid on the substrate having the first electrode layer formed thereon and curing the coating liquid to form a hole injection layer, wherein the coating liquid comprises a hole injection material and a curable binder.

15. The method according to claim 1, wherein the silane coupling agent is a silicon compound represented by:

$$Y_n SiX_{(4-n)},$$

where
Y is selected from the group consisting of an alkyl group, a fluoroalkyl group, a vinyl group, an amino group, a phenyl group, and an epoxy group;
X is selected from the group consisting of an alkoxyl group, an acetyl group, and a halogen group; and
n represents an integer of 0 to 3.

16. The method according to claim 1, wherein the silane coupling agent is a silicon compound represented by:

$$Y_n SiX_{(4-n)},$$

where
Y is selected from the group consisting of a functional group that is directly bonded to the silicon or bonded to the silicon through a vinyl group or a phenyl group and exhibits a hole transport property, a functional group that is directly bonded to the silicon or bonded to the silicon through a vinyl group or a phenyl group and exhibits an electron transport property, and a functional group that is directly bonded to the silicon or bonded to the silicon through a vinyl group or a phenyl group and exhibits both of the hole transport property and the electron transport property;
X is selected from the group consisting of an alkoxyl group, an acetyl group, and a halogen group; and
n represents an integer of 0 to 3.

17. The method according to claim 1, wherein said quantum dot has a core and a shell, wherein the core comprises a semiconductor fine particle, the shell surrounds the core and the shell comprises a material having a band gap larger than that of the semiconductor fine particle.

18. The method according to claim 1, wherein said quantum dot comprises semiconductor compound selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe, or a mixture thereof.

* * * * *